United States Patent [19]

Shibasaki et al.

[11] Patent Number: 5,453,727
[45] Date of Patent: Sep. 26, 1995

[54] SEMICONDUCTOR SENSORS AND METHOD FOR FABRICATING THE SAME

[75] Inventors: Ichiro Shibasaki; Naohiro Kuze; Tatsuro Iwabuchi; Kazuhiro Nagase, all of Fuji, Japan

[73] Assignee: Asahi Kasei Kogyo Kabushiki Kaisha, Osaka, Japan

[21] Appl. No.: 988,928

[22] PCT Filed: Jul. 16, 1992

[86] PCT No.: PCT/JP92/00908

§ 371 Date: Mar. 15, 1993

§ 102(e) Date: Mar. 15, 1993

[87] PCT Pub. No.: WO93/02479

PCT Pub. Date: Feb. 4, 1993

[30] Foreign Application Priority Data

Jul. 16, 1991 [JP] Japan .................. 3-175349

[51] Int. Cl.$^6$ .................................. H01L 43/00
[52] U.S. Cl. .................. 338/32 R; 324/207.21; 324/252; 338/2
[58] Field of Search ................ 338/32 R, 32 H, 338/2; 324/207.21, 252; 29/620

[56] References Cited

U.S. PATENT DOCUMENTS

| | | | |
|---|---|---|---|
| 4,926,154 | 5/1990 | Heremans et al. | 338/32 R |
| 4,978,938 | 12/1990 | Partin et al. | 338/32 R |
| 5,153,557 | 10/1992 | Partin et al. | 338/32 R |
| 5,184,106 | 2/1993 | Partin et al. | 338/32 R |

FOREIGN PATENT DOCUMENTS

| | | | |
|---|---|---|---|
| 0450601 | 10/1991 | European Pat. Off. | H01L/43/06 |
| 58-175833 | 10/1983 | Japan . | |
| 61-20378 | 1/1986 | Japan . | |
| 61-259583 | 11/1986 | Japan . | |
| 63-119590 | 5/1988 | Japan | H01L/43/06 |
| 2-24033 | 5/1990 | Japan . | |

OTHER PUBLICATIONS

Japanese Search Report dated Aug. 18, 1992, with English Translation.

*Primary Examiner*—Marvin M. Lateef
*Attorney, Agent, or Firm*—Finnegan, Henderson, Farabow, Garrett & Dunner

[57] ABSTRACT

The present invention is a method of fabrication of a thin film of $In_xGa_{1-x}As_ySb_{1-y}$, ($0<x\leq1.0$, $0\leq y\leq1.0$) having no lattice disorder, and its use in a sensor layer to obtain a high sensitivity semiconductor sensor having excellent temperature characteristics. The semiconductor sensor has a high resistance first compound semiconductor layer, a layer of $In_xGa_{1-x}As_ySb_{1-y}$ ($0<x\leq1.0$, $0\leq y\leq1.0$) grown on this first layer, and an electrode formed on this layer. The first compound semiconductor layer has a lattice constant the same as or nearly the same as that of the crystal of the sensor layer, and a band gap energy greater than that of the crystal. A second compound semiconductor layer similar to the first compound semiconductor layer may be formed on top of the sensor layer. A manufacturing method of such a semiconductor sensor is also included.

40 Claims, 19 Drawing Sheets

SEMICONDUCTOR SENSORS AND METHOD FOR FABRICATING THE SAME

TECHNICAL FIELD

The present invention relates to new semiconductor sensors.

BACKGROUND ART

Although indium arsenide (InAs) exhibits extremely high electron mobility, and should thus be particularly suitable for use in high sensitivity magnetic sensors, the following problems relating to its fabricating process and its characteristics exist;

(1) It is very difficult to grow a thin indium arsenide film having good crystallization and high electron mobility.

(2) the temperature characteristics of InAs when used as a magnetic sensor deteriorate at high temperatures due to the narrow band gap of the indium arsenide.

Attempts have been made to grow thin films of indium arsenide on various types of substrate. However, due to the large difference between the lattice constant of the indium arsenide and that of the insulating substrate on which the single crystal thin film of InAs is grown, lattice mismatch occurs near the interfacial boundary between the indium arsenide and the substrate itself. This results in low electron mobility so that adequate electron transport characteristics cannot be achieved. The resultant film is also susceptible to large changes in its characteristics during the fabricating process of the element, and there is also a tendency for the resistance temperature characteristics to be poor. Consequently, magnetic sensors wherein the magnetic sensing portion has a thin indium arsenide film, have a low electron mobility, making the fabrication of a high sensitivity magnetic sensors difficult.

In order to improve the temperature characteristics of the indium arsenide, tests have been made with a ternary alloy doped with gallium (Ga) to broaden the band gap. In this case indium phosphide (InP) having the same lattice constant as the InGaAs was used as the insulating substrate. In these tests, the composition ratio of In and Ga used to match the lattice of the InP was only $In_{0.53}Ga_{0.47}As$, and there was no insulating substrate corresponding to an arbitrary composition of InGaAs. As a result, even with the thin film growth of the InGaAs having a different lattice constant from that of the InP, as with the InAs, it was not possible to suppress the lattice mismatch occurring in the interface of the substrate. A high electron mobility thin film of InGaAs was therefore difficult to obtain. Furthermore, to obtain a high sheet resistance, it is necessary to have a thin layer. However due to the lattice mismatch inherent with a thin layer, it is difficult to control the carrier density. As a result, it is difficult to obtain a thin InAs film having the high electron mobility and high sheet resistance desirable for a magnetic sensor.

Present day technology related to magnetic sensors using InAs thin film as a magnetic sensing layer is disclosed in examined Japanese Patent Publication No. 2-24033, and unexamined Japanese Patent Laying-open Nos. 61-20378 and 61-259583. Examined Japanese Patent Publication No. 2-24033 proposes a Hall element wherein element temperature characteristics are improved by doping the magnetically sensitive layer of InAs with S, Si. With this element however, there is a drop in element resistance at high temperatures over 100° C., so that the element is not reliable for use at high temperatures as a Hall element. Unexamined Japanese Patent Laying-open No. 61-20378 proposes a Hall element having a magnetically sensitive crystalline layer of InAs or InGaAs grown on a semi-insulating GaAs substrate. With this element however there is lattice mismatch at the interface between the GaAs substrate and the InAs layer so that acceptable reliability and sensitivity cannot be obtained at high temperatures. Moreover, unexamined Japanese Patent Laying-open No. 61-259583 proposes a Hall element having a magnetically sensitive layer of InAs grown on a sapphire substrate. With this element however, a drop in element resistance was observed at high temperatures over 100° C. making this element also unreliable for use at high temperatures. Up until now we have therefore required different fundamental technology to realize magnetic sensors having very high sensitivity. Furthermore, this search does not stop with magnetic sensors, but is also applicable to the field of light, pressure and strain detection, and is aimed at the realization of detectors having high reliability and sensitivity in spite of miniaturization.

DISCLOSURE OF THE INVENTION

The present invention is directed to realization of high sensitivity semiconductor sensors, fabricated from a high electron mobility thin film sensor layer having minimal crystal lattice mismatch, so that its characteristics are not susceptible to change due to the fabricating process, and which also exhibits excellent high temperature characteristics.

The present inventor has investigated methods of fabricating thin film sensor layers with high electron mobility to solve the above problems inherent with InAs thin films, and has introduced these methods into the fabrication of high sensitivity semiconductor sensors. As a result of these investigations, a compound semiconductor layer having a large band gap energy greater than that for InAs, and a lattice constant the same as or close to that of InAs was formed. An InAs crystal was then grown on the compound semiconductor layer, and even though this had a thin film thickness, the InAs was observed to have an extremely high electron mobility. Moreover, if the before-mentioned compound semiconductor was used to match the lattice of the InAs, an extremely thin film of InAs having good crystallization could be grown, exhibiting an improvement in element characteristics, and due to the quantum effect of the extremely thin film InAs. Furthermore, with the InGaAs wherein Ga had been introduced into the InAs to make a wider band gap than that of the InAs, if a compound semiconductor was used in the InGaAs to match the lattice, it was possible to form an extremely thin film of InGaAs having good crystallization. Also, when this was used in an element, an improvement in temperature characteristics was observed. Furthermore, by taking advantage of the quantum effect due to the extremely thin film, and introducing Sb into the InAs or InGaAs, an even higher sensitivity could be realized.

That is to say, the magnetic sensor has a high resistance first compound semiconductor layer, an InAs layer formed on the first semiconductor layer, and an ohmic electrode formed on the InAs layer, wherein the lattice constant of the first compound semiconductor is the same as or close to that of the InAs, and the band gap energy thereof is greater than that of the InAs. Moreover, the InAs layer may be a ternary or quaternary mixed crystal with Ga or Sb introduced into the InAs layer. That is to say the InAs layer may have $In_xGa_{1-x}As$ (0<x<1.0), and $In_xGa_{1-x}As_ySb_{1-y}$ (0<x≦1.0, $0 \leq y < 1.0$). In the following, InAs, $In_xGa_{1-x}As$ ($0<x<1$) and $In_xGa_{1-x}As_ySb_{1-y}$ ($0<x \leq 1.0$, $0 \leq y<1.0$) layers are referred to in general as sensor layers.

Furthermore a high resistance second compound semiconductor layer having a lattice constant the same as or close to that of the crystal forming the sensor layer, and a band gap energy greater than that of said crystal may be formed on the surface of the sensor layer.

Moreover, in order to realize a high electron mobility with the reduction in defects at the interface of the sensor layer and the first or second compound semiconductor layers, it is preferable if the bonding at one or both of the interfaces, on the sensor layer side is formed with a Group III constituent selected from the crystal making up the sensor layer, and the bonding on the first or second compound semiconductor layer side, is formed with a Group V constituent selected from the compound semiconductor. Furthermore, the bonding of the interface for the sensor side may be formed with a Group V constituent selected from the crystal making up the sensor layer, and the bonding for the first or second compound semiconductor layers side may be formed with a Group III constituent selected from the compound semiconductor. An intermediate layer may also be inserted between the Group III and the Group V bonds.

In the sensor layer, electrical conducting electrons exist. The electron density in the sensor layer is preferably within the range from $5 \times 10^{16}$ to $8 \times 10^{18}/cm^3$, and more preferably in the range from $8 \times 10^{16}$ to $3 \times 10^{18}/cm^3$. The sensor layer may be doped with donor impurities as required. Also, doping of the first and second compound semiconductor layers which form a barrier layer for the sensor layer is possible. It is also common for a spacer layer to be inserted between the sensor layer and the doped barrier layer.

Preferably the electrode formed on the sensor layer of the present invention should be formed with a direct ohmic contact with the sensor layer. However, when there is a second compound semiconductor layer, the ohmic contact with the sensor layer via the second compound semiconductor layer may be achieved by annealing after formation of the electrode on the second compound semiconductor layer.

Another feature of the magnetic sensor of the present invention is the utilization of the Hall effect and the magnetoresistance effect, such as the Hall elements, magnetic resistance elements and the like.

Moreover, the method of fabrication of the magnetic resistance sensor involves the process of growing a high resistance first compound semiconductor layer, and growing the sensor layer on top of that layer, wherein the first compound semiconductor has a crystal and lattice constant the same as or substantially the same as that of the crystal forming the sensor layer, and a band gap energy greater than that of the crystal. The method also involves the process of treating the sensor layer, and the process of forming a plurality of ohmic electrodes on the surface of said sensor layer. If necessary, the process may also include the formation of a second compound semiconductor layer on the surface of the sensor layer. The process may also include the doping of the sensor layer and the first and second compound semiconductor layers as required. The range of the present invention also covers the formation of a electrode on the surface of the second semiconductor layer, and the formation of an ohmic contact with the sensor layer by a process such as annealing.

The magnetic sensor of the present invention may also be die bonded and wire bonded as necessary, and packaged. Packaging of the magnetic sensor together with a silicon IC chip is common.

A detailed description of the present invention is as follows.

FIG. 1 shows a high sensitivity Hall element as one example of a high sensitivity sensor according to the present invention. FIG. 1A shows a typical sectional view, while FIG. 1B shows a plan view. In FIGS. 1A, 1B numeral 1 denotes a substrate, numeral 3 denotes a sensor layer, and numeral 2 denotes a high resistance first compound semiconductor layer having a lattice constant the same as or nearly the same as that of the sensor layer 3, and a band gap energy larger than that of the crystal of the sensor layer 3. Numeral 4 (41, 42, 43, 44) denotes ohmic electrodes, and numeral 5 (51, 52, 53, 54) denotes electrodes for wire bonding. Here only the magnetic sensor chip is shown for brevity. FIG. 2 shows another working example of the present invention, having a high resistance second compound semiconductor layer 6. Also shown is a doped donor impurity 7 in the sensor layer. A passivation layer made of an insulator is formed on the surface of the semiconductor for protection as required.

With the present invention, the donor impurity 7 is shown in the sensor layer. However this impurity may be evenly distributed throughout the whole body, or located at a predetermined position only. For example, only the central portion may be doped, or one part may be doped and the other locations not doped. Also the central portion may be heavily doped and the surrounding portions lightly doped. Alternatively the central portions may be lightly doped with surrounding portions heavily doped with impurities. This may be achieved by separating the layers. With regards to the impurity for doping the sensor layer of the present invention, in general, if the impurity is used as a donor in the crystal of the sensor layer, then any impurity such as S, Si, Ge, Se may be used.

With the sensor layer of the present invention, the value of x for the proportion of In and Ga in the $In_xGa_{1-x}As_ySb_{1-y}$ layer of the sensor layer is $0<x \leq 1.0$, and preferably $0.6 \leq x \leq 1.0$. In order to take advantage of the high electron mobility of the InAs, a value of x of $0.8 \leq x \leq 1.0$ is desirable. The value of y for the proportion of As and Sb in the $In_xGa_{1-x}As_ySb_{1-y}$ layer is $0 \leq y \leq 1.0$, and preferably $0.4 \leq y \leq 1.0$, and more preferably in the region of $0.6 \leq y \leq 1.0$. The thickness of the sensor layer should be not more than 1.4 µm, preferably not more than 0.5 µm, and more preferably not more than 0.3 µm. Often a value less than 0.2 µm is used in making high sensitivity semiconductor sensors. Furthermore, values less than 0.1 µm are preferable for making semiconductor sensors with higher input resistance. By making the sensor layer thin, the electrons are shut in the sensor layer by the first and if necessary second compound semiconductor layer, thereby forming an quantum well. The heat resistance and the breakdown voltage are thus improved due to the quantum effect. To obtain this effect, the sensor layer thickness should be not more than 500Å, preferably not more than 300Å, and more preferably not more than 200Å. In particular when a thin film sensor layer is used, then with the present invention, donor impurity doping is carried out near the interface of the sensor layer and the first or second compound semiconductor layers. The electrons supplied from the impurity pass across the interface to supply the sensor layer. As a result, the scattering of electrons due to the impurities in the sensor layer is reduced, and thus an even higher electron mobility is obtained. In this case the electrical conductor in the sensor layer depends on the electrons supplied from the first or second compound semiconductor layer to the sensor layer. Mixed conduction by the electrons existing in the sensor layer, and the electrons supplied from the donor impurity atom doped in the sensor layer may also occur.

FIG. 3 shows another example of semiconductor sensors according to the present invention. Numeral 9 indicates a donor impurity doped in the high resistance compound semiconductor layer to achieve the above mentioned effects. FIG. 3A shows an example of a first compound semiconductor layer doped with donor impurities, while FIG. 3B shows an example of a doped second compound semiconductor layer. The electrons in the sensor layer supplied from the donor impurities 9, may form an electron gas spreading in two dimensions. However these are collected in the electrical conductor together with electrons supplied from the donor impurity 7 in the sensor layer. Anything which act as a donor impurity, may be suitable for this purpose. However preferably Si, S, Ge, Se and the like should be used.

The resistance of the high resistance first or second semiconductor layer used in the semiconductor sensor of the present invention should preferably be that of an insulator or semi-insulator, or be a correspondingly high resistance value. For example, the resistance of the first or second compound semiconductor layer should be at least 5–10 times as high as the resistance of the sensor layer, preferably 100 times higher, and more preferably 1000 times higher.

With the sensor layer used in the semiconductor sensor of the present invention formed as above, the first and second compound semiconductor layers are generally compound semiconductors having a lattice constant the same as or close to that of the crystal of the sensor layer, and may have a band gap energy value higher than that of the crystal. For example, it may be possible to have a composition such as GaSb, AlSb, $Al_{a1}Ga_{1-a1}Sb$, $GaAs_{c1}Sb_{1-c1}$, $AlAs_{c1}Sb_{1-c1}$, $Al_{a1}Ga_{1-a1}As_{c1}Sb_{1-c1}$, $Al_{b1}In_{1-b1}As_{c2}Sb_{1-c2}$, $Al_{b2}In_{1-b2}P_{d1}Sb_{1-d1}$, and $Al_{a2}Ga_{1-a2}P_{d2}Sb_{1-d2}$ which have lattice constants the same as or close to that of the crystal of the sensor layer. Furthermore it is desirable to have a material having a band gap energy higher than that of the crystal. For the compound semiconductor layer $Al_{a1}Ga_{1-a1}As_{c1}Sb_{1-c1}$, the range of ($0 \leq a1 \leq 1.0$, $0 \leq c1 \leq 0.6$) is preferable, and ($0.5 \leq a1 \leq 1.0, 0 \leq c1 \leq 0.4$) is more preferable. With $Al_{b1}In_{1-b1}As_{c2}Sb_{1-c2}$, the range of ($0.2 \leq b1 \leq 1.0$, $0 \leq c2 \leq 1.0$) is preferable, and ($0.5 \leq b1 \leq 1.0$, $0 \leq c2 \leq 0.8$) is more preferable. With $Al_{b2}In_{1-b2}P_{d1}Sb_{1-d1}$, the range of ($0 \leq b2 \leq 1.0$, $0 \leq d1 \leq 1.0$) is preferable, and ($0.1 \leq b2 \leq 1.0$, $0.1 \leq d1 \leq 0.8$) is more preferable. With $Al_{a2}Ga_{1-a2}P_{d2}Sb_{1-d2}$, the range of ($0 \leq a2 \leq 1.0$, $0 \leq d2 \leq 0.5$) is preferable, and ($0.5 \leq a2 \leq 1.0$, $0 \leq d2 \leq 0.35$) is more preferable. With regards to the closeness in values of the lattice constants of the first and second compound semiconductor layers, and the lattice constant of the crystal of the sensor layer, the difference between the lattice constant of the compound semiconductor and that of the crystal of the sensor layer should be within ±5% and more preferably within ±2%.

The thickness $l_1$ of the first compound semiconductor layer is preferably in the range from 0.1 µm $\leq l_1 \leq$ 10 µm, and more preferably in the range from 0.5 µm $\leq l_1 \leq$ 5 µm. To obtain the quantum effect in the sensor layer, this value should preferably be not less than 1 µm. The thickness $l_2$ of the second compound semiconductor layer normally corresponds to that of the first compound semiconductor layer. Generally a range not greater than 1 µm, preferably not greater than 0.5 µm, and more preferably not greater than 0.1 µm is used. Furthermore, the first and second compound semiconductor layers may be formed as multiple layers comprising a number of semiconductors selected from compound semiconductors. For example, a third compound semiconductor layer may be formed on the second compound semiconductor layer. The third compound semiconductor layer may be made of a semiconductor insulating layer corresponding to the second compound semiconductor layer, with a similar thickness of $l_2$. The second and third compound semiconductor layers prevent sensor layer from oxidation in air. They also provide a protective effect against damage by passivation.

The type of bonding at the interface between the sensor layer and the first and second compound semiconductor layers may be In—Sb, Ga—Sb, Ga—As, In—As, Al—As, Al—Sb, In—P, Ga—P. Of these, In—Sb is preferable. An intermediate layer may be inserted between the Group III–Group V layer. FIG. 4 shows an enlarged view of such type of interface bonding. In forming the interface bond with the interface between the first compound semiconductor layer and the sensor layer, after growth of the first compound semiconductor layer, only the Group V (Group III) selected from the compound semiconductor layer is irradiated. Then, Group V (Group III) irradiation is stopped, and at the same time only the Group III (Group V) selected from the crystal of the sensor layer is irradiated. Subsequently, irradiation of the Group III and Group V remaining from the sensor layer crystal is commenced, and the sensor layer grown. With the interface between the sensor layer and second compound semiconductor layer, after growth of the sensor layer, only the Group III (Group V) selected from the sensor layer crystal is irradiated. Irradiation of the Group III (Group V) is then stopped, and at the same time the Group V (Group III) selected from the second compound semiconductor is irradiated. Then irradiation of the remaining elements of the second compound semiconductor is commenced, and the second compound semiconductor layer grown. The interface layer may be grown to only several atomic layers and preferably only one atomic layer by irradiation of the Group III and Group V constituents.

The electrode making up the semiconductor sensor of the present invention is normally an ohmic electrode. In this case it is preferable to form an ohmic contact directly with the sensor layer. The electrode however may be formed on the second compound semiconductor layer, with ohmic contact with the sensor layer through the second compound semiconductor. With this construction the layer is formed as follows. To obtain ohmic contact between the electrode and sensor layer, annealing for alloy is carried out to diffuse the electrode material into the sensor layer from the second compound semiconductor. Alternatively, a method wherein a donor impurity is implanted only into the region below the electrode by ion implantation to give a reduction in contact resistance may be used. With the metal electrodes, the known multiple layer construction with an initial three layers of AuGe/Ni/Au is possible. However it is also possible to have single layers of metal such as Al, Ti, Au, W, or a large variety of combinations.

With the semiconductor sensor of the present invention, especially when made for light, pressure and stress sensing, it is possible to form a non-ohmic electrode. A transparent electrode for light transmission may also be formed.

The substrate used for fabricating the magnetic sensor of the present invention may in general be formed of any material that can be formed as a single crystal. This may preferably be a single crystal semi-insulating substrate of GaAs, or a single crystal substrate of Si. The (100) or (110) plane is generally used as the plane for growing the crystal. In order to improve the crystal growth, it is common to use those which are shifted at several angles from these planes. For example, 2° misoriented plane from (100) may be preferable. Furthermore, in the process for the fabrication of magnetic sensors wherein an insulating substrate such as mica is used, the thin film layer grown on the mica surface may be also be transferred. That is to say, with the fabricated magnetic sensor, the substrate is not in effect used.

With the fabricating method of the magnetic sensor of the present invention, the processes for forming the first compound semiconductor, the sensor layer, and the second compound semiconductor may in general involve any process whereby a single crystal thin film can be grown. The molecular beam epitaxy method, the metal organic vapor phase epitaxy (MOVPE) method or the atomic layer epaitaxy (ALE) method may however be particularly suitable.

The process for making the sensor layer to a required predetermined shape may involve processes such as wet etching, dry etching and ion milling. These processes may also be used if necessary for producing the first and second compound semiconductor layers in a predetermined shape.

FIG. 5 shows a magnetic resistor according to a basic example of a high sensitivity magnetic sensor of the present invention. FIG. 5A shows a cross sectional view of a two terminal magnetic resistor, while FIG. 5B shows a plan view. FIG. 5C is a plan view of a three terminal differential type magnetic resistor. Numeral 10 indicates short bar electrodes. These have the effect of increasing the magnetic resistance effect, and may be used to increase magnetic sensitivity. The short bar electrodes 10 of FIG. 5 are in ohmic contact with the sensor layer 3, and are normally made of metal.

The magnetic sensor of the present invention may be used for a magnetic sensor such as a Hall IC or magnetic resistance IC in which a Si IC chip for amplifying the sensor output is packaged together with the magnetic sensor. FIG. 6 shows this example with a magnetic sensor chip 11, an Si IC chip 12, an island portion 13 on a lead 14, a wire 15, and mold resin 16.

As well as being used as a magnetic sensor, the semiconductor sensor of the present invention may also be used as a light sensor, pressure sensor, or strain sensor. In this case a high resistance first compound semiconductor layer may be grown on a semi-insulating substrate, and a sensor layer then grown on this layer. An optical sensor may then be produced by forming a light detecting electrode on the sensor layer. A second compound semiconductor layer may also be formed on the sensor layer. A quantum well may also be formed, by growing an ultra thin film sensor layer. It may also be possible to produce an optical sensor with a superlattice construction wherein a first or second compound semiconductor barrier layer and ultra thin film sensor layer are grown alternately. An optical sensor of the type shown in FIG. 18 with a transparent electrode on the surface may be also be made using the semiconductor sensor of the present invention. With this optical sensor, lattice mismatch does not occur at the interface between the lattice adjusting compound semiconductor layer and the sensor layer, so that the dark current which is a problem with light sensors may be kept very small. Furthermore, since the electron mobility of the sensor layer is extremely large, higher response speed is possible. The optical sensor is thus ideal for use as an optical sensor for detection in the mid-infrared region (2–8 μm).

A pressure sensor may also be formed in a similar manner to the above examples. In this case, a high resistance first compound semiconductor layer is formed. A sensor layer is then grown on top of this layer, and a electrode for detecting a pressure force is formed on the sensor layer. Alternatively, a second compound semiconductor layer may be grown on the sensor layer. By growing an ultra thin film sensor layer, a quantum well may be produced. Also, by growing alternate barrier layers comprising first and second compound semiconductors, and ultra thin film sensor layers, a superlattice may be produced. The electrode of the pressure sensor of the present invention may be a direct ohmic contact with the sensor layer. However, when a second compound semiconductor layer is grown on the sensor layer, the electrode may be formed on the second compound semiconductor layer, and the ohmic contact with the sensor layer achieved by annealing. Furthermore, a non-ohmic electrode may be grown as a surface electrode on the second compound semiconductor layer as shown in FIG. 16 and FIG. 17. The band gap of the sensor layer of the present invention is small compared to that for GaAs or Si, so that a higher sensitivity pressure sensor can be produced. Up until now a good InAs type pressure sensor has not been possible due to the problems with growing an InAs thin film having good crystallization and minimal lattice mismatch. However if a sensor layer grown on the surface of the lattice matching compound semiconductor layer of the present invention is used, it is possible to produce a high sensitivity pressure sensor which takes full advantage of the InAs thin film characteristics.

A strain sensor may also be formed in a similar manner to the above examples. In this case a first compound semiconductor layer is formed. A sensor layer is then grown on top this layer, and a electrode for detecting strain is formed at a predetermined position on the sensor layer. Alternatively, a second compound semiconductor layer may be grown on the sensor layer. By growing an ultra thin film sensor layer, a quantum well may be produced. Also, by growing alternate barrier layers having first or second compound semiconductors, and ultra thin film sensor layers, a superlattice may be produced.

Examples of actual optical, pressure and strain sensors according to the present invention are given below.

FIG. 15 shows an example of a semiconductor sensor according to the present invention which utilizes a change in resistance. FIG. 15A is a sectional view of the element construction, while FIG. 15B is a plan view. The sensor comprises a substrate 1, a lattice adjusting first compound semiconductor layer 2, a sensor layer 3 made in the shape shown in FIG. 15B with an ohmic electrode 17. With this type of semiconductor sensor, the resistance of the treated sensor layer changes with the application of light, pressure, or strain, and this change is detected. FIG. 15C shows a typical condition under strain.

FIG. 16 shows another example of a semiconductor sensor according to the present invention which utilizes a change in resistance. The sensor has a second compound semiconductor layer 6, respective ohmic electrodes 18, 19, and a non-ohmic central electrode 20. With this type of semiconductor sensor, the resistance value change between the electrodes due to light, pressure, and strain is detected. Furthermore, the sensitivity of the semiconductor may be adjusted by applying a voltage across the central electrode.

FIG. 17 shows an example of a semiconductor sensor according to the present invention. The sensor has an insulating second compound semiconductor layer 6, an ohmic electrode 21, and a collector electrode 22 grown on the second compound semiconductor layer 6. When a voltage is applied to these collector electrodes, an electrical charge is produced at the interface with the insulating second compound semiconductor layer 6. With this semiconductor sensor, a change in electric charge due to light, pressure or strain is detected.

FIG. 18 shows another example of a semiconductor sensor according to the present invention. The sensor has an ohmic electrode 23, and a transparent electrode 24. As with the example of FIG. 17, a change in capacitance due to light, pressure or strain is detected as a voltage change between the electrodes.

FIG. 19 shows practical examples of elements which use semiconductor sensors of the present invention. FIG. 19A shows an example of a light sensor with identical light sensors 25 and 26. The light sensor 26 is shown with the light shut off. The sensor is connected by electrodes 27, 28 and 29. Normally it is preferable to form the light sensors on the same substrate. However it may be possible to form the light sensors on separate substrates and assemble these together. In fact, the example of FIG. 19A uses the semiconductor sensor shown in FIG. 15, and measurements were carried out with this as a light sensor. The results gave a resistance value between the electrodes 28–29 when shaded of 1480Ω. In comparison, the resistance value between the electrodes 27–28 when illuminated was 75Ω greater. A change in resistance value due light illumination was thus confirmed. FIG. 19B shows a semiconductor sensor 30 according to the present invention, with an external resistance 31. The present invention can thus be seen to extend to sensor constructions involving circuit elements such as external resistors integrated together with the semiconductor sensors of the present invent ion.

BRIEF DESCRIPTION OF THE DRAWINGS

FIG. 15A is a sectional view, FIG. 15B is a plan view of FIG. 15A.

FIGS. 19 and 19B are typical views showing an example of an actual use of a semiconductor sensor according to the present invention. FIG. 19A shows an example of an optical sensor, while FIG. 19B shows examples of light, pressure and strain sensors.

BEST MODE FOR CARRYING OUT THE INVENTION

Examples of the present invention are given below. However, it is to be understood that the present invention is not limited to these examples.

EXAMPLE 1-a

A first compound semiconductor layer of undoped $Al_{0.8}Ga_{0.2}As_{0.16}Sb_{0.84}$ is grown to a thickness of 0.30 μm on the surface of a two inch diameter GaAs substrate by the molecular-beam epitaxy (MBE) method. A sensor layer of Si doped InAs is then grown to a thickness of 0.25 μm on this layer. This InAs thin film has an electron mobility of 19000 $cm^2/Vs$, a sheet resistance of 150Ω/unit area and an electron density of $0.88 \times 10^{17} cm^{-3}$.

Subsequently, a resist pattern for the formation of a magnetically sensitive portion is formed on the overlying thin film grown on the GaAs substrate, using a photolithographic technique. The unwanted areas are then successively etched away with $H_3PO_4$ system etchant, and the resist removed. A 0.2 μm film of SiN is then deposited over the entire surface of the wafer using a plasma chemical vapor deposition (CVD) technique. A resist pattern for the openings at the electrode portions is then formed on the SiN layer by the photolithographic technique, and the SiN portion for the electrode etched by reactive ion etching, to expose the sensor layer. Then successive vacuum deposition techniques are used to deposit a 2000Å AuGe (Au:Ge=88:12) layer, a 500Å Ni layer, and a 3500Å Au layer. The electrode pattern for the Hall element is then obtained by the normal lift-off method. In this way, several Hall elements can be made on the two inch wafer. The individual Hall elements are then cut out from the growth using a dicing saw. The chip size of the Hall element made in this way is 0.36 mm×0.36 mm.

The resultant Hall elements are then die bonded and wire bonded. Transfer molding is carried out to produce epoxy resin molded Hall element.

The film and element characteristics are given later in Tables 1 and 2 respectively.

Figure 1A:
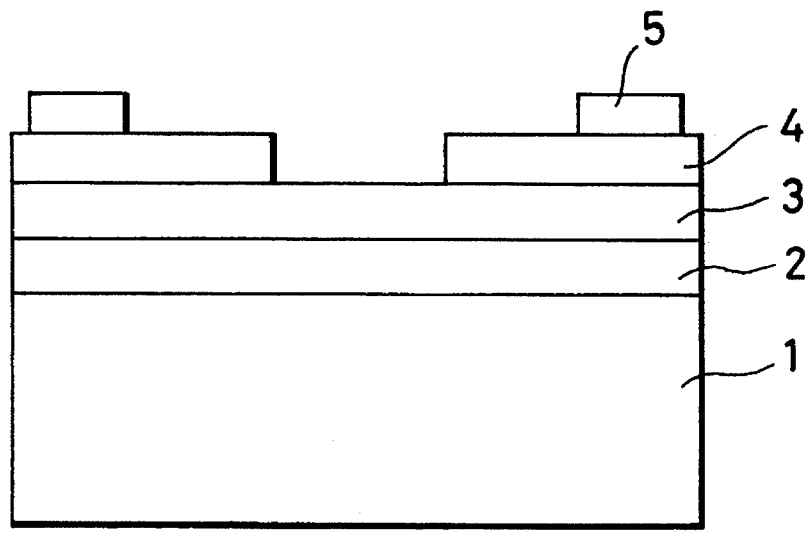
FIGS. 1A and 1B are respective sectional and plan views showing a construction of a Hall element, being an example of a magnetic sensor substrate according to the present invention.
Figure 1B:
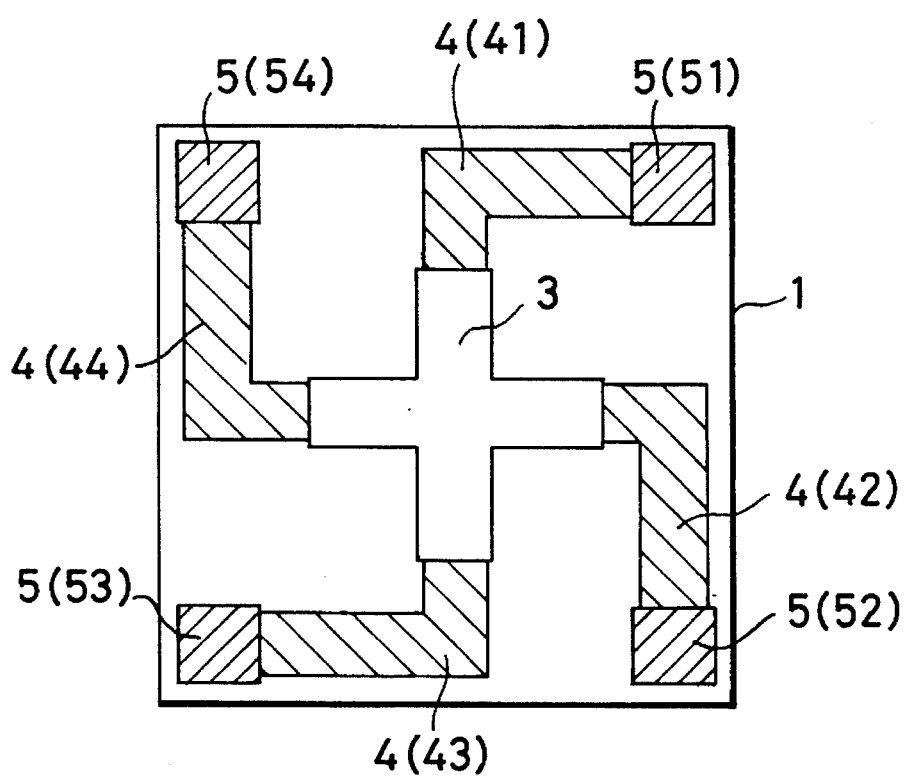
Figure 2:
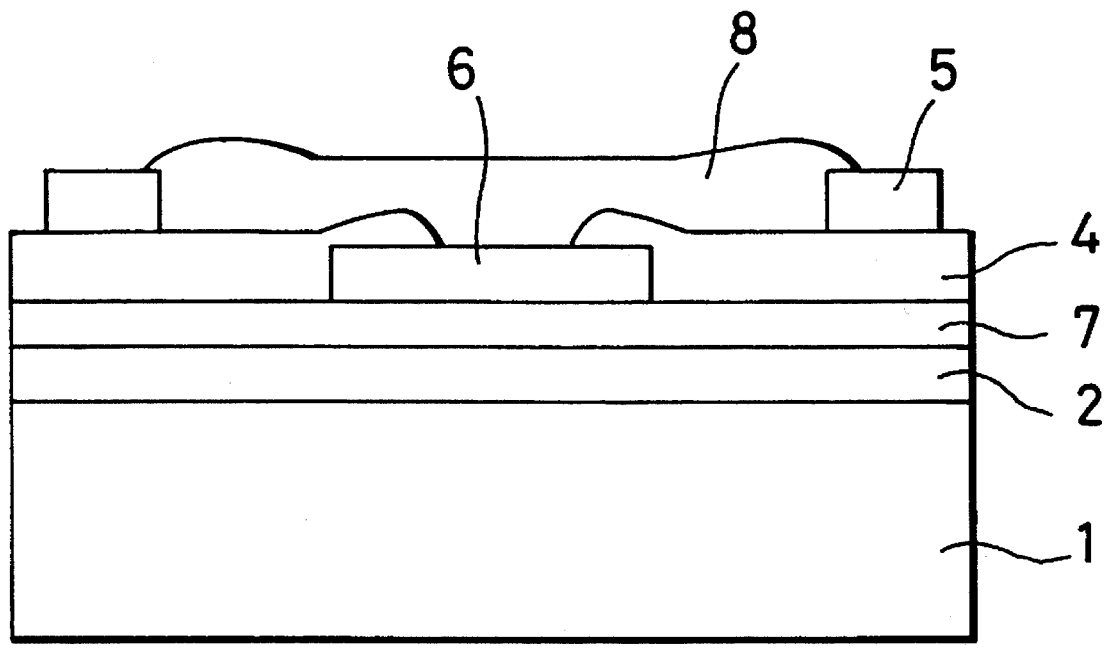
FIG. 2 is a sectional view showing another example of the present invention having a second compound semiconductor layer.
Figure 3A:
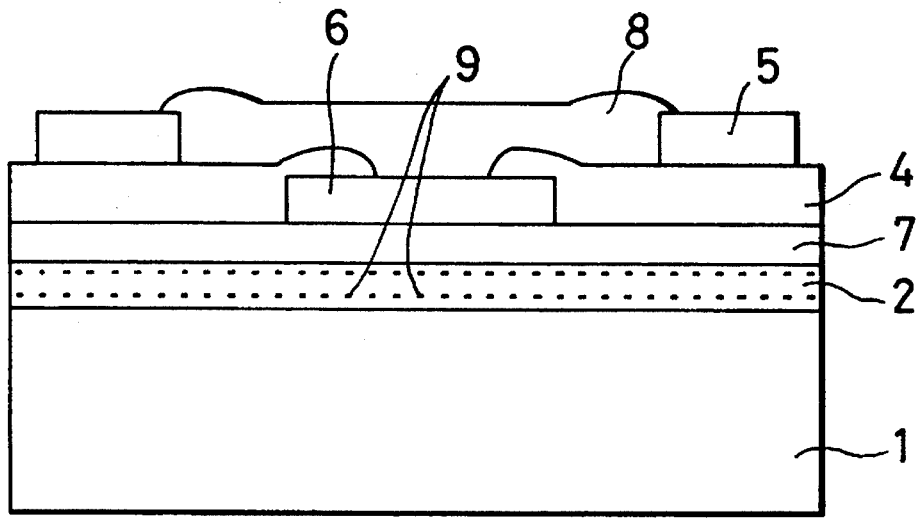
FIGS. 3A and 3B are sectional views showing a example having a construction wherein the electrons are supplied from a first or second compound semiconductor layer.
Figure 3B:
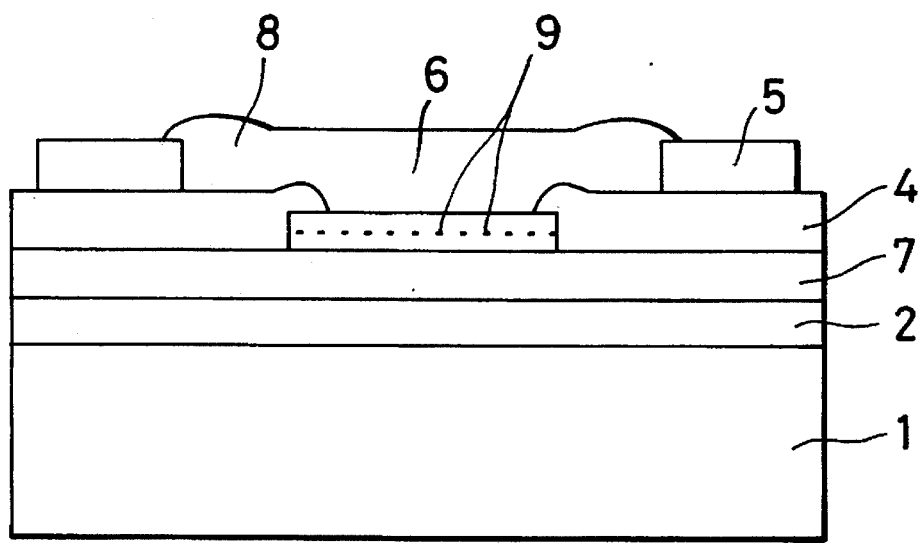
Figure 4:
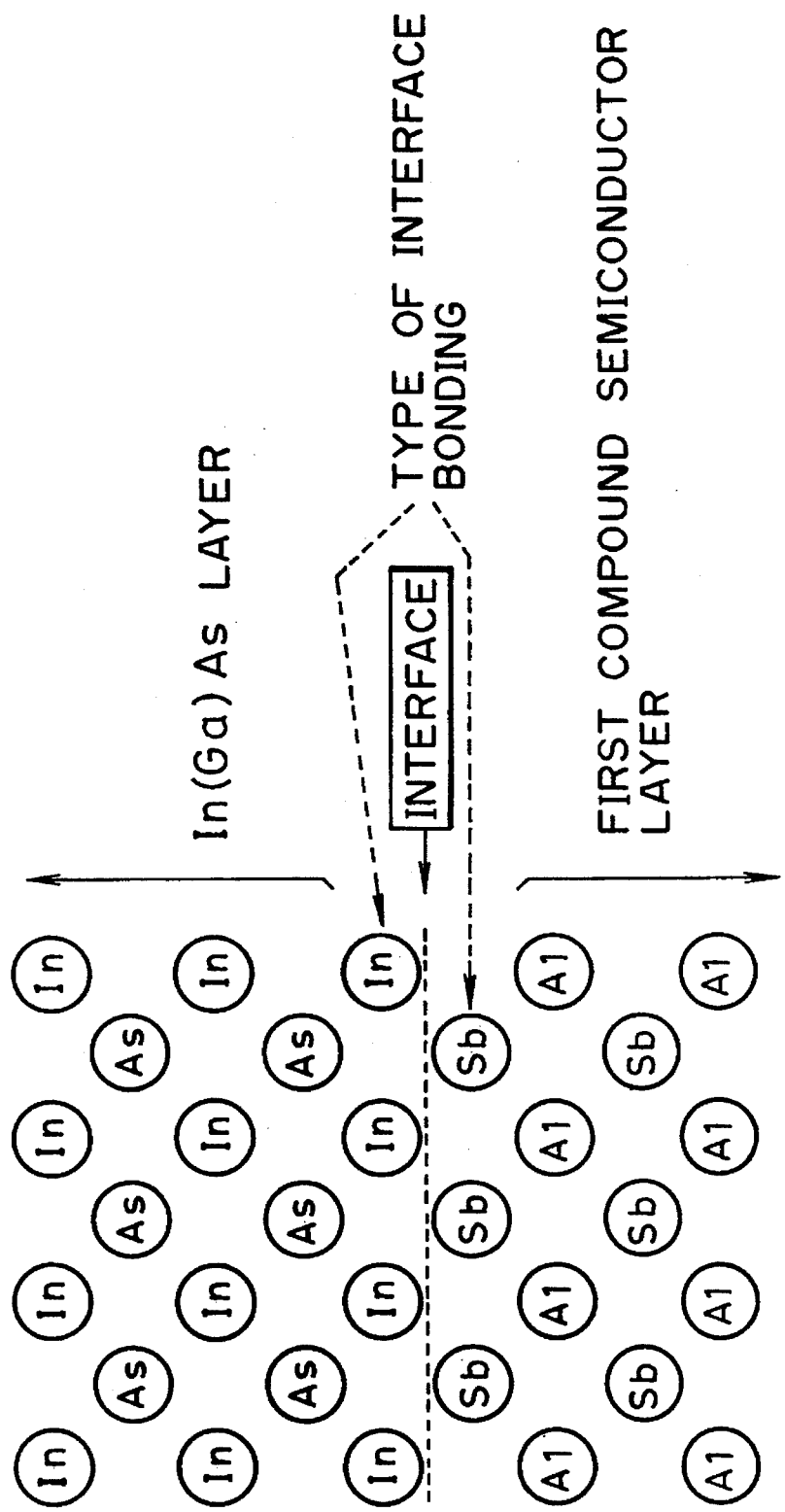
FIG. 4 is an enlarged typical view of an interfacial bond between an InAs layer and a first compound semiconductor layer.
Figure 5A:
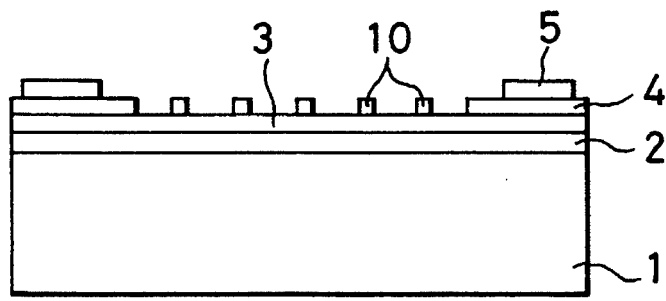
FIGS. 5A, 5B and 5C are respective sectional and plan views showing an example of a magnetic resistor, being one example of a magnetic sensor according to the present invention.
Figure 5B:
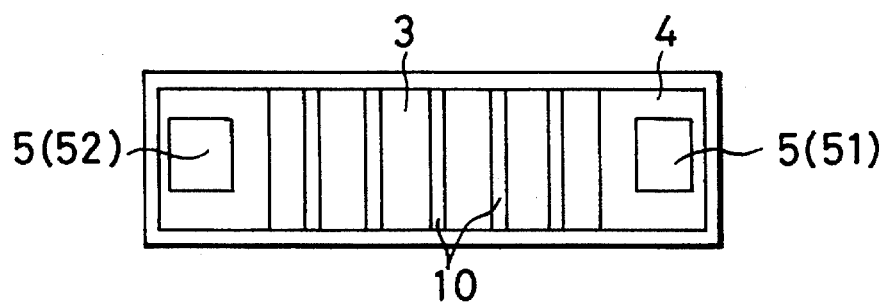
Figure 5C:
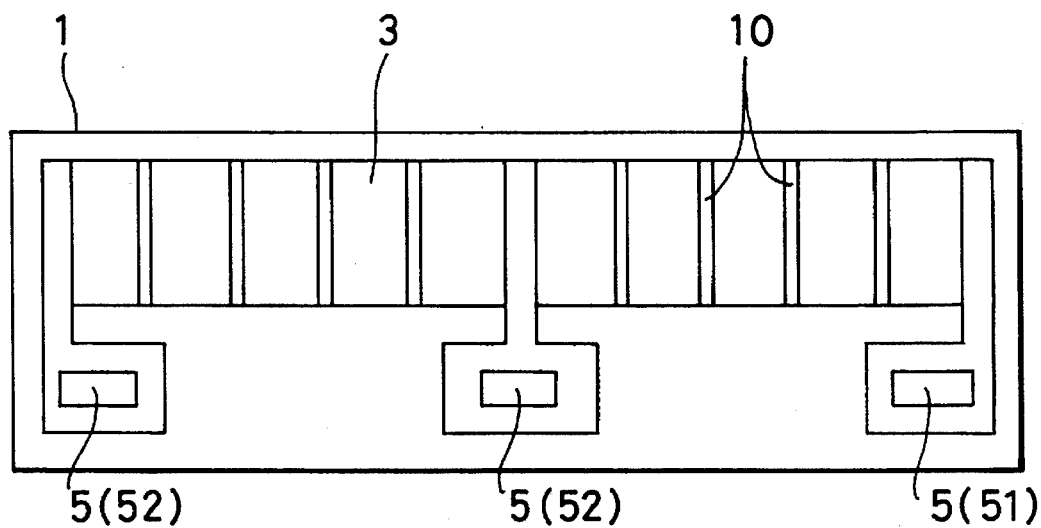
Figure 6:
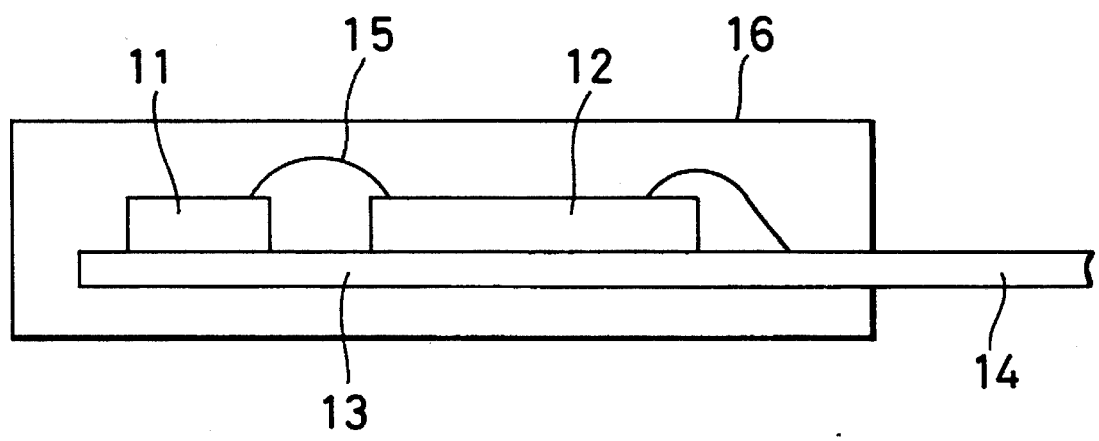
FIG. 6 is a typical sectional view showing an example of a hybrid magnetic sensor according to the present invention, wherein a Hall element as one example of a magnetic sensor of the present invention, is molded together in the same package with the silicon IC chip of an IC circuit.
Figure 7:
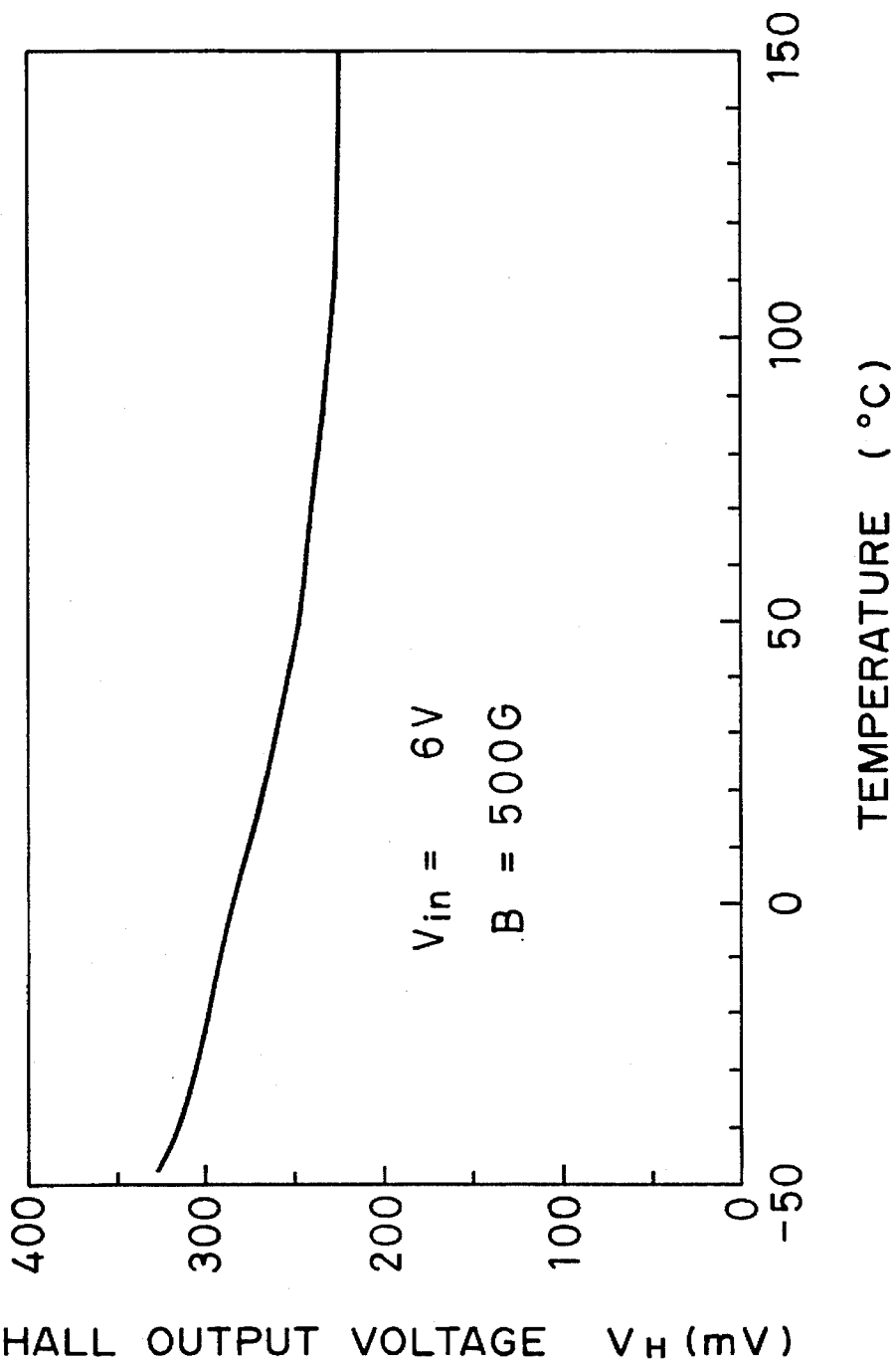
FIG. 7 is a characteristic diagram showing the temperature characteristics of the Hall output voltage for a first example of the present invention.
Figure 8:
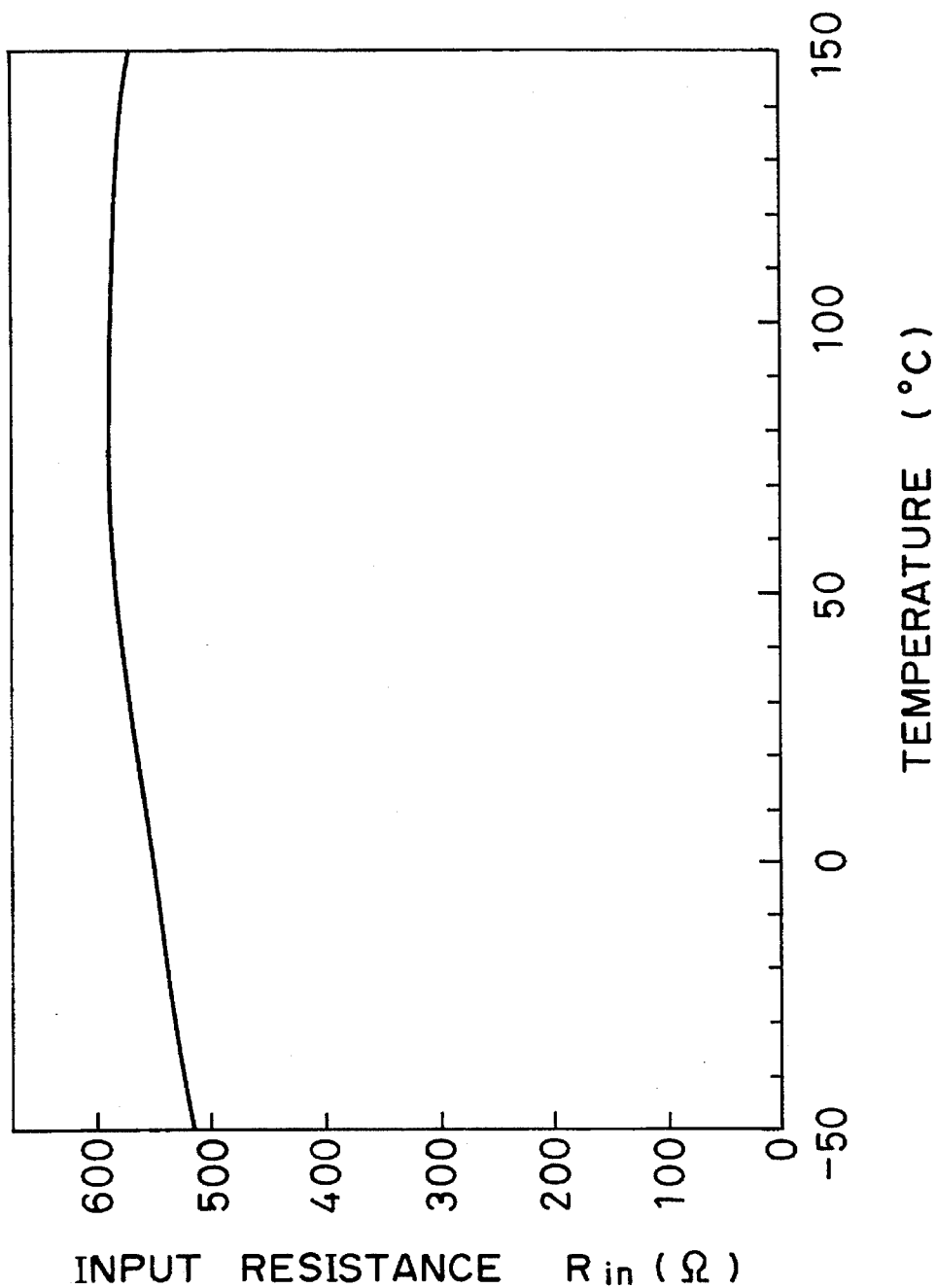
FIG. 8 is a characteristic diagram showing the temperature variation of the input resistance for a first example according to the present invention.

As shown in Table 2, the Hall element of the first example 1-a had a large Hall output voltage of 210 mV for a rated input voltage when subjected to a magnetic flux density of 500 G. This value is more than twice the average Hall output voltage of a GaAs Hall element. The temperature characteristics of the Hall output voltage are shown in FIG. 7. The temperature variation of the Hall output voltage at a constant voltage is small even at temperatures above 100° C. and shows excellent temperature characteristics. As shown in FIG. 8, the temperature variation of the input resistance is very small up to 150° C., and the drop in resistance is also extremely small. Furthermore, when molded in a standard mini mold, the heat radiation coefficient is only approximately 2.3 mW/°C. Hence the element can be used at the previously impossible temperatures of 100° to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 1b

Using the same method as for example 1-a, a first compound semiconductor layer of undoped $Al_{0.8}Ga_{0.2}As_{0.16}Sb_{0.84}$ was grown to a thickness of 0.30 μm. A layer of undoped InAs was then grown to a thickness of 0.25 μm on this layer. This InAs thin film had an electron mobility of 12000 cm$^2$/Vs, a sheet resistance of 520Ω/unit area and an electron density of $4.00\times10^{16}$cm$^{-3}$.

A Hall element was then made in the same way as for example 1-a, and the properties measured under the same conditions. With a Hall output voltage of 150 mV, and an input resistance of 1.1 kΩ, the drop in resistance in the high temperature region above 100° C. was found to be a little lower than that for example 1-a.

EXAMPLE 2

A first compound semiconductor layer of undoped $Al_{0.8}Ga_{0.2}As_{0.16}Sb_{0.84}$ is grown to a thickness of 0.30 μm on the surface of a two inch diameter GaAs substrate by the molecular-beam epitaxy (MBE) method. A sensor layer of Si doped InAs is then grown to a thickness of 0.15 μm on this layer. This InAs thin film has an electron mobility of 19000 cm$^2$/Vs, a sheet resistance of 230Ω/unit area and an electron density of $0.95\times10^{17}$ cm$^{-3}$.

A Hall element was then made as follows in a similar manner to that of example 1-a.

The thin film and element characteristics are given later in Tables 1 and 2 respectively.

As shown in Table 2, the Hall element of the second example had a large Hall output voltage of 260 mV for a rated input voltage when subjected to a magnetic flux density of 500 G. This value is more than twice the average Hall output voltage of a GaAs Hall element. The temperature dependence of the Hall output voltage showed the same characteristics as for example 1-a. The temperature dependence of the input resistance was also extremely small up to 150° C. as with example 1-a. With this extremely low temperature dependence of the input resistance, and very small drop in resistance, the possibility of failure under an overload current when used at the rated voltage is minimized, and reliability at high temperatures is also good. Furthermore with low temperature use, even at temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 3

A first compound semiconductor layer of undoped $Al_{0.8}Ga_{0.2}As_{0.16}Sb_{0.84}$ is grown to a thickness of 0.30 μm on the surface of a two inch diameter GaAs substrate by the molecular-beam epitaxy (MBE) method. A sensor layer of Si doped InAs is then grown to a thickness of 0.10 μm on this layer. This InAs thin film has an electron mobility of 19000 cm$^2$/Vs, a sheet resistance of 300Ω/unit area and an electron density of $1.1\times10^{17}$ cm$^{-3}$. A Hall element was then made as follows in a similar manner to that of example 1-a.

The thin film and element characteristics are given later in Tables 1 and 2 respectively.

As shown in Table 2, the Hall element of the third example had a large Hall output voltage of 270 mV for a rated input voltage when subjected to a magnetic flux density of 500 G. This value is more than twice the average Hall output voltage of a GaAs Hall element. The temperature dependence of the Hall output voltage showed the same characteristics as for example 1-a. The temperature dependence of the input resistance was also extremely small up to 150° C. as with example 1. With this extremely low temperature dependence of the input resistance, and very small drop in resistance, the possibility of failure under an overload current when used at the rated voltage is minimized, and reliability at high temperatures is also good. Furthermore with low temperature use, even at temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

COMPARATIVE EXAMPLE 1

Using the same method as for example 3, a layer of undoped $Al_{0.8}Ga_{0.2}As_{0.5}Sb_{0.5}$ was grown to a thickness of 0.30 μm. A layer of undoped InAs was then grown to a thickness of 0.10 μm on this layer. The surface morphology of the InAs thin film was poor, and sheet resistance too high so measurement of electron mobility was not possible. The lattice constant of the AlGaAsSb layer differed from that of the InAs and it was apparent that an InAs thin film having good crystallization could not be obtained. A Hall element also was not possible.

EXAMPLE 4

A first compound semiconductor layer of undoped $Al_{0.8}Ga_{0.2}As_{0.16}Sb_{0.84}$ is grown to a thickness of 0.3 μm on the surface of a two inch diameter GaAs substrate by the molecular-beam epitaxy (MBE) method. A sensor layer of Si doped InAs is then grown to a thickness of 0.10 μm on this layer. A second compound semiconductor layer of undoped $Al_{0.8}Ga_{0.2}As_{0.16}Sb_{0.84}$ is then grown to a thickness of 500Å on this layer and then a cap layer of $GaAs_{0.16}Sb_{0.84}$ is grown on this layer to a thickness of 100Å. This InAs thin film has an electron mobility of 21000 $cm^2/Vs$, a sheet resistance of 280Ω/unit area and an electron density of $1.1 \times 10^{17}$ $cm^{-3}$.

Subsequently, a resist pattern for the formation of a magnetically sensitive portion is formed on the overlying thin film grown on the GaAs substrate, using a photolithographic technique. The unwanted areas are then successively etched away with $H_{3PO4}$ system etchant, and the resist removed. A 0.2 μm film of SiN is then deposited over the entire surface of the wafer using a plasma chemical vapor deposition (CVD) technique. A resist pattern for the openings at the electrode portions is then formed on the SiN layer by the photolithographic technique, and the SiN portion for the electrode etched by reactive ion etching. The unrequired portions on the second compound semiconductor layer and the cap layer are then removed with HCl system etchant to expose the sensor layer. Then successive vacuum deposition techniques are used to deposit a 2000Å AuGe (Au:Ge= 88:12) layer, a 500Å Ni layer, and a 3500Å Au layer. The electrode pattern for the Hall element is then produced by the normal lift-off method. In this way, several Hall elements can be made on the two inch wafer. The individual Hall elements are then cut out from the growth using a dicing saw. The chip size of the Hall element made in this way is 0.36 mm × 0.36 mm.

The resultant Hall elements are then die bonded and wire bonded. Transfer molding is carried out to produce an epoxy resin molded Hall element.

The film and element characteristics are given later in Tables 1 and 2 respectively.

As shown in Table 2, the Hall element of the fourth example had a large Hall output voltage of 309 mV for a rated input voltage when subjected to a magnetic flux density of 500 G. This value is more than three times the average Hall output voltage of a GaAs Hall element. The temperature characteristics of the Hall output voltage, as with example 1-a showed good characteristics even above 100° C. The temperature dependence of the input resistance, also, as with example 1-a, showed very small change with temperature, and a very small drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −50° C. no problems are experienced. The element is thus reliable for use over a wide range of temperatures.

EXAMPLE 5

A first compound semiconductor layer of $Al_{0.8}Ga_{0.2}As_{0.32}Sb_{0.68}$ is grown to a thickness of 0.30 μm on the surface of a two inch diameter GaAs substrate by the molecular-beam epitaxy (MBE) method. A sensor layer of Si doped $In_{0.8}Ga_{0.2}As$ is then grown to a thickness of 0.10 μm on this layer. This $In_{0.8}Ga_{0.2}As$ thin film has an electron mobility of 15500 $cm^2/Vs$, a sheet resistance of 330Ω/unit area and an electron density of $1.22 \times 10^{17}$ $cm^{-3}$.

A Hall element was then made as follows in a similar manner to that of example 1-a.

The thin film and element characteristics are given later in Tables 1 and 2 respectively.

Figure 9:
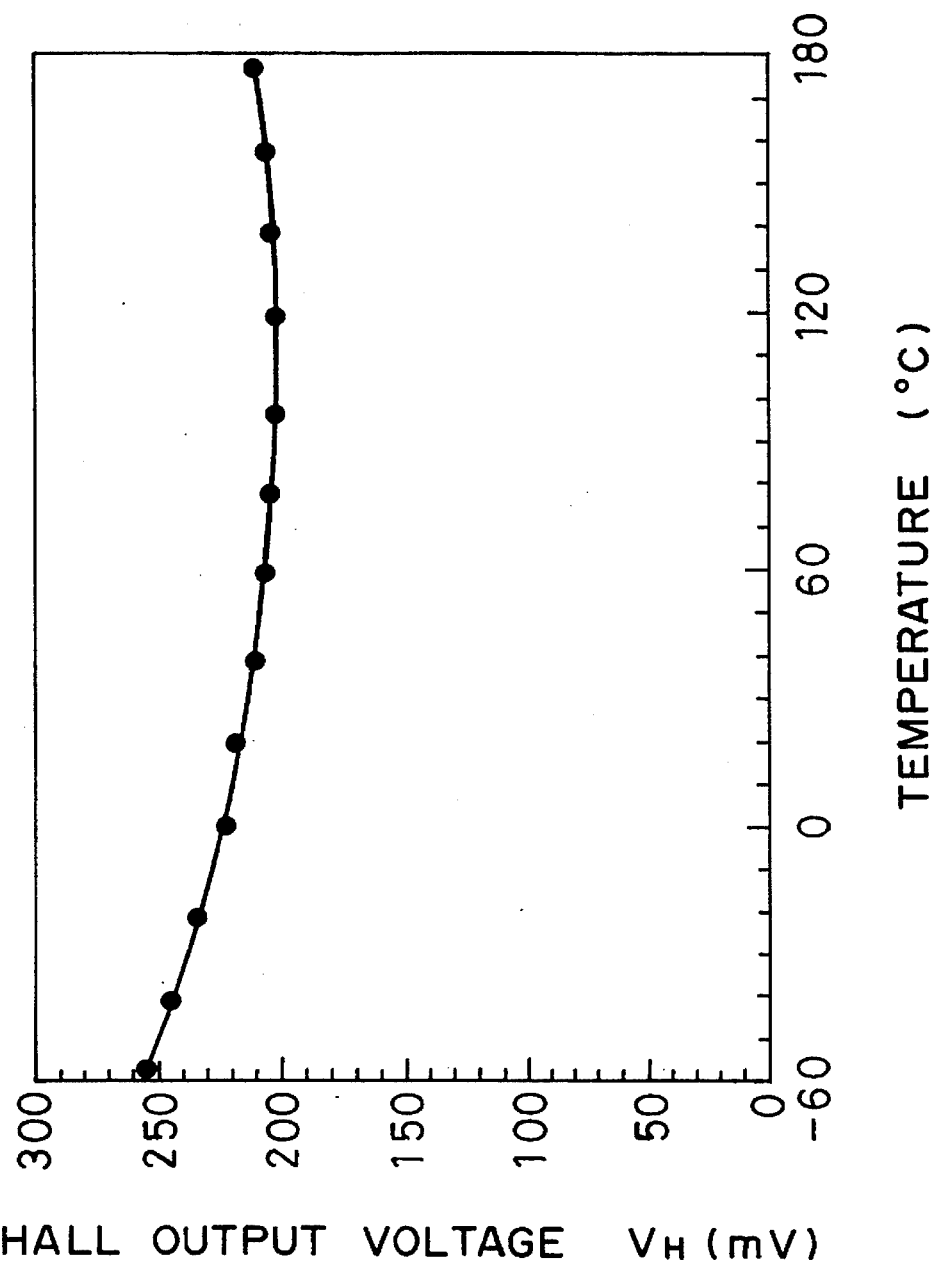
FIG. 9 is a characteristic diagram showing the temperature characteristics of the Hall output voltage for a fifth example according to the present invention.
Figure 10:
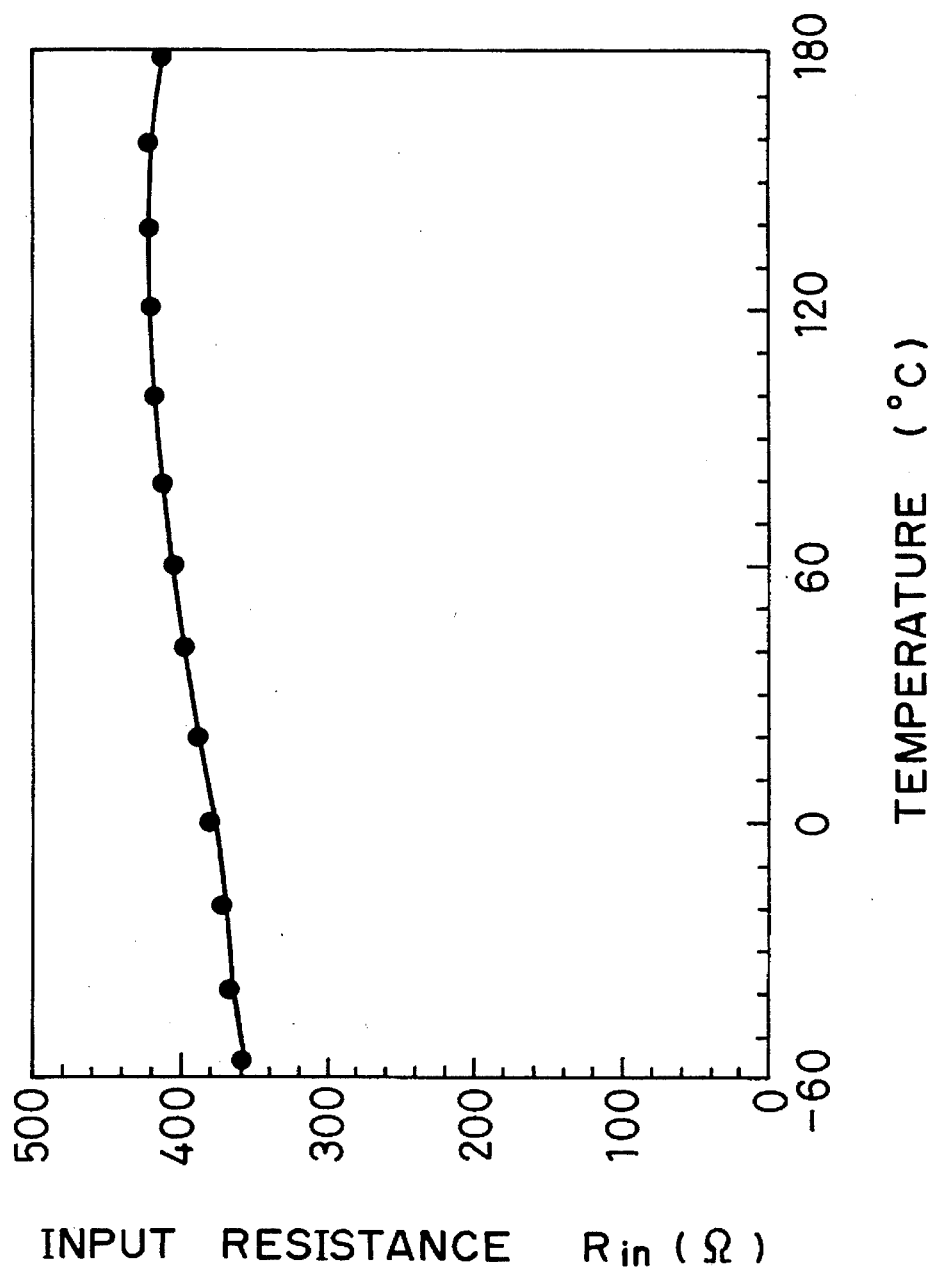
FIG. 10 is a diagram showing the temperature variation of the element resistance for the fifth example of the present invention.

As shown in Table 2, the Hall element of the fifth example had a large Hall output voltage of 200 mV for a rated input voltage when subjected to a magnetic flux density of 500 G. This value is more than twice the average Hall output voltage of a GaAs Hall element. The Hall output voltage temperature characteristics are shown in FIG. 9. The temperature variation of the Hall output voltage at a rated voltage is small even at temperatures over 100° C., showing excellent temperature characteristics. Furthermore, as shown in FIG. 10 the input resistance change with temperature is small up to 150° C., and no drop in resistance is observed. Consequently the possibility of failure under an overload current when used at the rated voltage is minimized, and reliability at high temperatures is also good. The element can thus be used at previously impossible high temperatures. Furthermore with low temperature use, even at temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high. The element also has low power consumption and compared to the GaAs Hall element this is less than half for the same sensitivity.

COMPARATIVE EXAMPLE 2

As with example 5, an undoped layer of $Al_{0.8}Ga_{0.2}As_{0.6}Sb_{0.4}$ is grown to a thickness of 0.30 μm. A layer of Si doped $In_{0.8}Ga_{0.2}As$ is then grown to a thickness of 0.10 μm on this layer. This $In_{0.8}Ga_{0.2}As$ thin film however had poor surface mobility so that measurement of electron mobility was not possible. A Hall element also was not possible.

EXAMPLE 6

A first compound semiconductor layer of undoped $Al_{0.8}Ga_{0.2}As_{0.23}Sb_{0.77}$ is grown to a thickness of 0.30 μm on the surface of a two inch diameter GaAs substrate by the molecular-beam epitaxy (MBE) method. A sensor layer of Si doped $In_{0.8}Ga_{0.2}As$ is then grown to a thickness of 0.10 μm on this layer. A second compound semiconductor layer of undoped $Al_{0.8}Ga_{0.2}As_{0.23}Sb_{0.77}$ is then grown to a thickness of 500Å on this layer and then a cap layer of $GaAs_{0.23}Sb_{0.77}$ is grown on this layer to a thickness of 100Å.

This $In_{0.8}Ga_{0.2}As$ thin film has an electron mobility of 19000 $cm^2/Vs$, a sheet resistance of 310Ω/unit area and an electron density of $1.06 \times 10^{17}$ $cm^{-3}$.

A Hall element was then made as follows in a similar manner to that of example 4.

The thin film and element characteristics are given later in Tables 1 and 2 respectively.

As shown in Table 2, the Hall element of the sixth example had a large Hall output voltage of 240 mV for a rated input voltage when subjected to a magnetic flux density of 500 G. This value is more than twice the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

EXAMPLE 7

A first compound semiconductor layer of undoped $Al_{0.8}Ga_{0.2}As_{0.45}Sb_{0.55}$ is grown to a thickness of 0.30 μm on the surface of a two inch diameter GaAs substrate by the molecular-beam epitaxy (MBE) method. A sensor layer of Si doped $In_{0.65}Ga_{0.35}As$ is then grown to a thickness of 0.10 μm on this layer. A second compound semiconductor layer of undoped $Al_{0.8}Ga_{0.2}As_{0.45}Sb_{0.55}$ is then grown to a thickness of 500Å on this layer and then a cap layer of $GaAs_{0.45}Sb_{0.55}$ is grown on this layer to a thickness of 100Å. This $In_{0.65}Ga_{0.35}As$ thin film has an electron mobility of 13000 cm$^2$/Vs, a sheet resistance of 380Ω/unit area and an electron density of $1.26 \times 10^{17}$ cm$^{-3}$.

A Hall element was then made as follows in a similar manner to that of example 4.

The thin film and element characteristics are given later in Tables 1 and 2 respectively.

As shown in Table 2, the Hall element of the seventh example had a large Hall output voltage of 195 mV for a rated input voltage when subjected to a magnetic flux density of 500 G. This value is more than twice the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

EXAMPLE 8

A first compound semiconductor layer of undoped $Al_{0.8}Ga_{0.2}As_{0.75}Sb_{0.25}$ is grown to a thickness of 0.30 μm on the surface of a two inch diameter GaAs substrate by the molecular-beam epitaxy (MBE) method. A sensor layer of Si doped $In_{0.3}Ga_{0.7}As$ is then grown to a thickness of 0.10 μm on this layer. A second compound semiconductor layer of undoped $Al_{0.8}Ga_{0.2}As_{0.75}Sb_{0.25}$ is then grown to a thickness of 500Å on this layer and then a cap layer of $GaAs_{0.75}Sb_{0.25}$ is grown on this layer to a thickness of 100Å. This $In_{0.3}Ga_{0.7}As$ thin film has an electron mobility of 9000 cm$^2$/Vs, a sheet resistance of 420Ω/unit area and an electron density of $1.65 \times 10^{17}$ cm$^{-3}$.

A Hall element was then made as follows in a similar manner to that of example 4.

The thin film and element characteristics are given later in Tables 1 and 2 respectively.

As shown in Table 2, the Hall element of the eighth example had a Hall output voltage of 140 mV for a rated input voltage when subjected to a magnetic flux density of 500 G. This value is approximately 1.5 times the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

EXAMPLE 9

A first compound semiconductor layer of undoped $Al_{0.8}In_{0.2}As_{0.3}Sb_{0.7}$ is grown to a thickness of 0.3 μm on the surface of a two inch diameter GaAs substrate by the molecular-beam epitaxy (MBE) method. A sensor layer of Si doped $In_{0.8}Ga_{0.2}As_{0.3}Sb_{0.7}$ is then grown to a thickness of 0.10 μm on this layer. A second compound semiconductor layer of undoped $Al_{0.8}In_{0.2}As_{0.3}Sb_{0.7}$ is then grown to a thickness of 500Å on this layer. This $In_{0.8}Ga_{0.2}As_{0.3}Sb_{0.7}$ thin film has an electron mobility of 20000 cm$^2$/Vs, a sheet resistance of 270Ω/unit area and an electron density of $1.15 \times 10^{17}$ cm$^{-3}$.

Subsequently, a resist pattern for the formation of a magnetically sensitive portion is formed on the overlying thin film grown on the GaAs substrate, using a photolithographic technique. The unwanted areas are then successively etched away with $H_3PO_4$ system etchant, and the resist removed. A 0.2 μm film of SiN is then deposited over the entire surface of the wafer using a plasma chemical vapor deposition (CVD) technique. A resist pattern for the openings at the electrode portions is then formed on the SiN layer by the photolithographic technique, and the SiN portion for the electrode etched by reactive ion etching. The unrequired portions on the second compound semiconductor layer are then removed with HCl system etchant to expose the sensor layer. Then successive vacuum deposition techniques are used to deposit a 2000Å AuGe (Au:Ge=88:12) layer, a 500Å Ni layer, and a 3500Å Au layer. The electrode pattern for the Hall element is then produced by the normal lift-off method. In this way, several Hall elements can be made on the two inch wafer. The individual Hall elements are then cut out from the growth using a dicing saw. The chip size of the Hall element made in this way is 0.36 mm×0.36 mm.

The resultant Hall elements are then die bonded and wire bonded. Transfer molding is carried out to produce an epoxy resin molded Hall element.

The film and element characteristics are given later in Tables 1 and 2 respectively.

As shown in Table 2, the Hall element of the ninth example had a Hall output voltage of 300 mV for a rated input voltage when subjected to a magnetic flux density of 500 G. This value is approximately 3 times the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

COMPARATIVE EXAMPLE 3

As with example 9, an undoped layer of $Al_{0.8}In_{0.2}As_{0.7}Sb_{0.3}$ is grown to a thickness of 0.30 μm. A layer of Si doped $In_{0.8}Ga_{0.2}As_{0.3}Sb_{0.7}$ is then grown to a thickness of 0.10 μm on this layer. Undoped $Al_{0.8}In_{0.2}As_{0.7}Sb_{0.3}$ is then grown to a thickness of 500Å on this layer. The $In_{0.8}Ga_{0.2}As_{0.3}Sb_{0.7}$ thin film however had poor surface mobility and very high sheet resistance so that measurement of electron mobility was not possible. A Hall element also was not possible.

EXAMPLE 10

A first compound semiconductor layer of undoped $Al_{0.8}In_{0.2}As_{0.05}Sb_{0.95}$ is grown to a thickness of 0.3 μm on the surface of a two inch diameter GaAs substrate by the molecular-beam epitaxy (MBE) method. A sensor layer of Si doped $In_{0.8}Ga_{0.2}As_{0.5}Sb_{0.5}$ is then grown to a thickness of 0.10 μm on this layer. A second compound semiconductor layer of undoped $Al_{0.8}In_{0.2}As_{0.05}Sb_{0.95}$ is then grown to a thickness of 500Å on this layer. This $In_{0.8}Ga_{0.2}As_{0.5}Sb_{0.5}$ thin film has an electron mobility of 21000 cm$^2$/Vs, a sheet resistance of 270Ω/unit area and an electron density of $1.10×10^{17}$ cm$^{-3}$.

A Hall element was then made as follows in a similar manner to that of example 9.

The film and element characteristics are given later in Tables 1 and 2 respectively.

As shown in Table 2, the Hall element of the tenth example had a Hall output voltage of 310 mV for a rated input voltage when subjected to a magnetic flux density of 500 G. This value is approximately 3 times the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

EXAMPLE 11

A first compound semiconductor layer of undoped $Al_{0.4}In_{0.6}As_{0.05}Sb_{0.95}$ is grown to a thickness of 0.3 μm on the surface of a two inch diameter GaAs substrate by the molecular-beam epitaxy (MBE) method. A sensor layer of Si doped $In_{0.8}Ga_{0.2}As_{0.2}Sb_{0.8}$ is then grown to a thickness of 0.10 μm on this layer. A second compound semiconductor layer of undoped $Al_{0.4}In_{0.6}As_{0.05}Sb_{0.95}$ is then grown to a thickness of 500Å on this layer. This $In_{0.8}Ga_{0.2}As_{0.2}Sb_{0.8}$ thin film has an electron mobility of 21000 cm$^2$/Vs, a sheet resistance of 250Ω/unit area and an electron density of $1.19×10^{17}$ cm$^{-3}$.

A Hall element was then made as follows in a similar manner to that of example 9.

The film and element characteristics are given later in Tables 1 and 2 respectively.

As shown in Table 2, the Hall element of the eleventh example had a Hall output voltage of 305 mV for a rated input voltage when subjected to a magnetic flux density of 500 G. This value is approximately 3 times the average Hall output voltage of a GaAs Hall element. The temperature characteristics of the Hall output voltage, as with example 5 showed good characteristics even above 100° C. The temperature dependence of the input resistance, also, as with example 5, showed very small change with temperature, and no apparent drop in resistance. Furthermore, the heat radiation coefficient of the element when molded in a standard mini mold, is only approximately 2.3 mW/°C. Hence the element can be used at the previously impossible temperatures of 100° C. to 150° C. With the Hall element as one of the magnetic sensors of the present invention, the Hall output voltage in the magnetic field is large resulting in high sensitivity. The Hall element can also be used at high temperatures, and reliability is extremely high. Furthermore with low temperature use, even at temperatures down to −60° C. no problems are experienced. The element is thus reliable for use over a wide range of temperatures.

EXAMPLE 12

In order to obtain a Hall element utilizing the quantum effect, a first compound semiconductor layer of undoped $Al_{0.8}Ga_{0.2}As_{0.16}Sb_{0.84}$ is grown to a thickness of 1.0 μm on the surface of a two inch diameter GaAs substrate by the molecular-beam epitaxy (MBE) method. A sensor layer of undoped InAs is then grown to a thickness of 150Å on this layer. A second compound semiconductor layer of undoped $Al_{0.8}Ga_{0.2}As_{0.16}Sb_{0.84}$ is then grown to a thickness of 500Å on this layer, and then a cap layer of $GaAs_{0.16}Sb_{0.84}$ is grown on this layer to a thickness of 100Å. This InAs thin film has an electron mobility of 15000 cm$^2$/Vs, a sheet resistance of 200Ω/unit area and an electron density of $1.39×10^{18}$ cm$^{-3}$.

The quantum well formed by the thin film was also verified.

A Hall element was then made as follows in a similar manner to that of example 4.

The thin film and element characteristics are given later in Tables 3 and 4 respectively.

Figure 11:
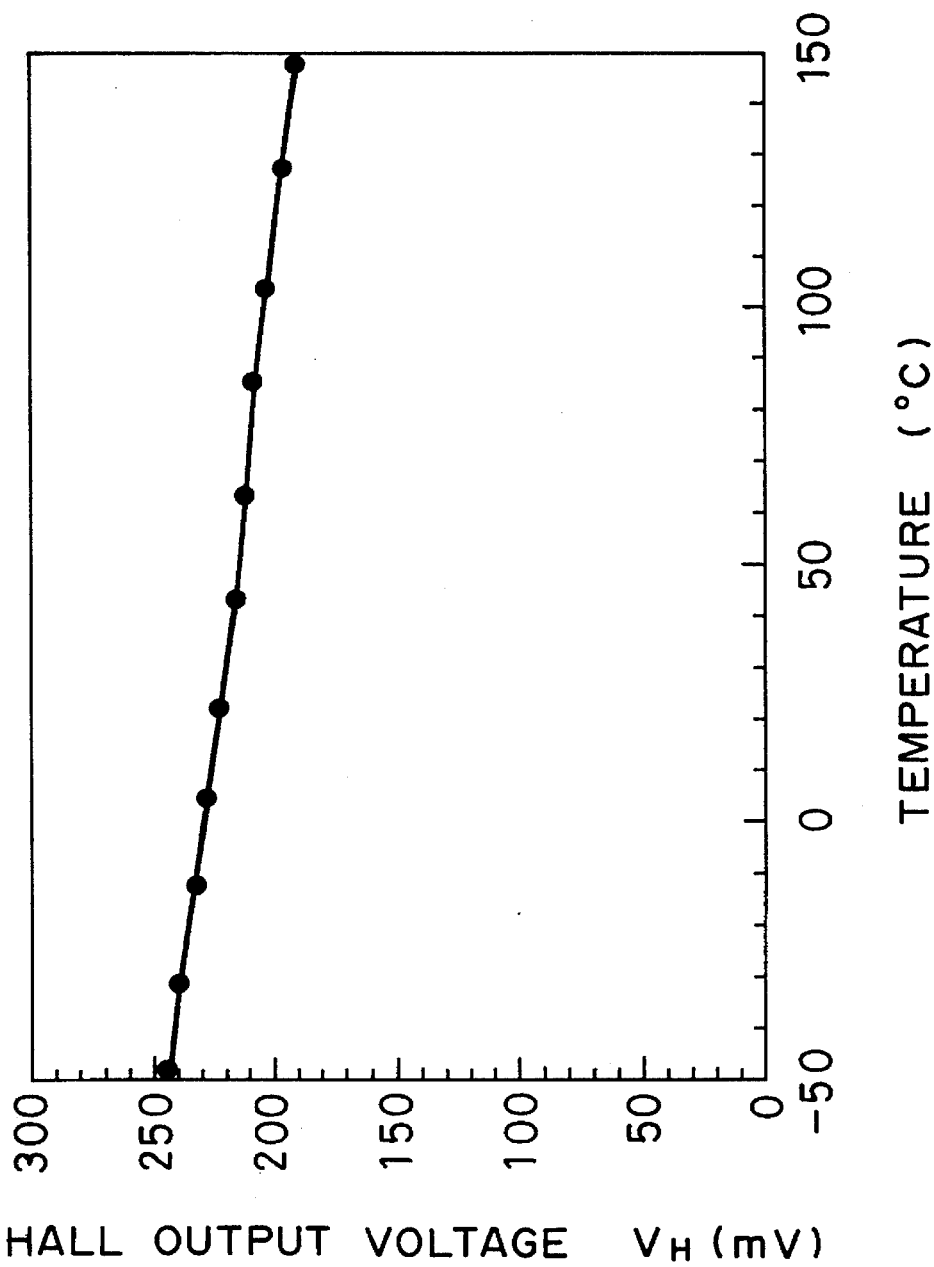
FIG. 11 is a characteristics diagram showing the temperature characteristics of the Hall output voltage for a twelfth example of the present invention.
Figure 12:
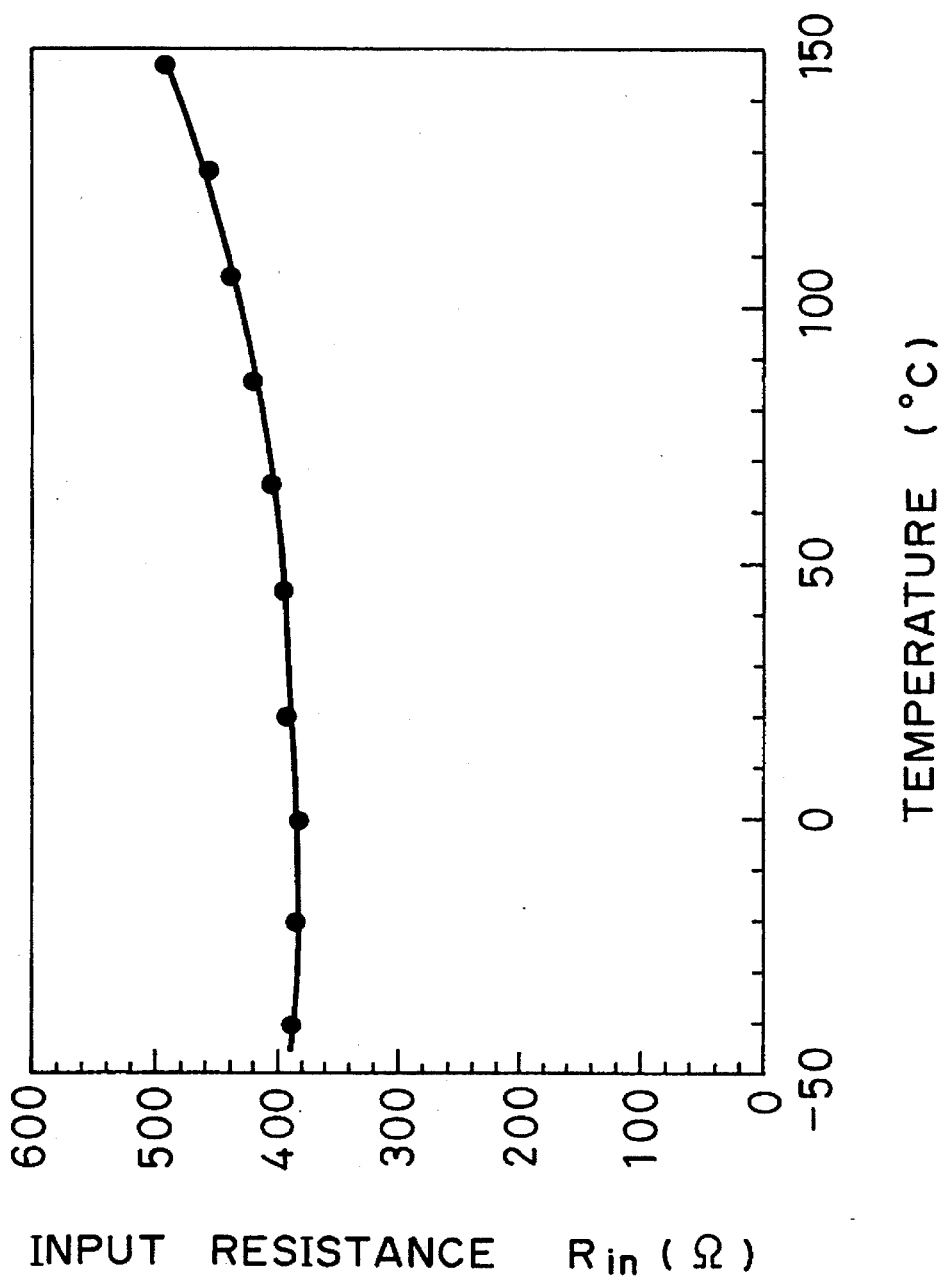
FIG. 12 is a characteristic diagram showing the temperature variation of the element resistance for the twelfth example of the present invention.

As shown in Table 4, the Hall element of the twelfth example had a large Hall output voltage of 220 mV for a rated input voltage when subjected to a magnetic flux density of 500 G. This value is more than twice the average Hall output voltage of a GaAs Hall element. The temperature characteristics of the Hall output voltage are shown in FIG. 11. The temperature variation of the Hall output voltage at a constant voltage is small even at temperatures above 100° C. showing excellent temperature characteristics. As shown in FIG. 12, the input resistance variation with temperature shows no drop up to approximately 150° C., indicating excellent temperature characteristics. Consequently the possibility of failure under an overload current when used at the rated voltage is minimized, and reliability at high temperatures is also good. Furthermore, the heat radiation coefficient of an element molded in a standard mini mold, is only approximately 2.3 mW/°C. Hence the element can be used at the previously impossible temperatures of 100° C. to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

COMPARATIVE EXAMPLE 4

As with example 12, an undoped $Al_{0.8}Ga_{0.2}As_{0.5}Sb_{0.5}$ is grown to a thickness of 1.0 μm on the surface of a two inch diameter GaAs substrate. An undoped InAs is then grown to a thickness of 150Å. An undoped $Al_{0.8}Ga_{0.2}As_{0.5}Sb_{0.5}$ is then grown to a thickness of 500Å, and then a cap layer of $GaAs_{0.5}Sb_{0.5}$ is grown to a thickness of 100Å. The surface morphology of the growth layer showed a slight blooming. This InAs thin film has an electron mobility of 2300 $cm^2/Vs$, a sheet resistance of 1030Ω/unit area and an electron density of $1.75 \times 10^{18}$ $cm^{-3}$. A Hall element was made by the method of example 4, however this had a Hall output voltage of only 35 mV, and an extremely high input resistance of 2 kΩ. Furthermore, the Hall output voltage, and input resistance were strongly dependent on temperature changes, and the input resistance dropped markedly at high temperatures.

EXAMPLE 13

In order to obtain a Hall element utilizing the quantum effect, a first compound semiconductor layer of undoped $Al_{0.8}Ga_{0.2}As_{0.16}Sb_{0.84}$ is grown to a thickness of 1.0 μm on the surface of a two inch diameter GaAs substrate by the molecular-beam epitaxy (MBE) method. A sensor layer of undoped InAs is then grown to a thickness of 200Å on this layer. A second compound semiconductor layer of undoped $Al_{0.8}Ga_{0.2}As_{0.16}Sb_{0.84}$ is then grown to a thickness of 500Å on this layer, and then a cap layer of $GaAs_{0.16}Sb_{0.84}$ is grown on this layer to a thickness of 100Å. This InAs thin film has an electron mobility of 15000 $cm^2/Vs$, a sheet resistance of 215Ω/unit area and an electron density of $0.97 \times 10^{18}$ $cm^{-3}$. The quantum well formed by the thin film was also verified.

A Hall element was then made as follows in a similar manner to that of example 4.

The thin film and element characteristics are given later in Tables 3 and 4 respectively.

As shown in Table 4, the Hall element of the thirteenth example had a large Hall output voltage of 225 mV for a rated input voltage when subjected to a magnetic flux density of 500 G. This value is more than twice the average Hall output voltage of a GaAs Hall element. The Hall output voltage variation with temperature, like example 12 was small, and the input resistance variation with temperature also, as with example 12 shows no drop up to approximately 150° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 14

In order to obtain a Hall element utilizing the quantum effect, a first compound semiconductor layer of undoped $Al_{0.8}Ga_{0.2}As_{0.16}Sb_{0.84}$ is grown to a thickness of 1.0 μm on the surface of a two inch diameter GaAs substrate by the molecular-beam epitaxy (MBE) method. A sensor layer of undoped InAs is then grown to a thickness of 300Å on this layer. A second compound semiconductor layer of undoped $Al_{0.8}Ga_{0.2}As_{0.16}Sb_{0.84}$ is then grown to a thickness of 500Å on this layer, and then a cap layer of $GaAs_{0.16}Sb_{0.84}$ is grown on this layer to a thickness of 100Å. This InAs thin film has an electron mobility of 15000 $cm^2/Vs$, a sheet resistance of 250Ω/unit area and an electron density of $0.56 \times 10^{18}$ $cm^{-3}$.

A Hall element was then made as follows in a similar manner to that of example 4.

The thin film and element characteristics are given later in Tables 3 and 4 respectively. As shown in Table 4, the Hall element of the fourteenth example had a large Hall output voltage of 210 mV for a rated input voltage when subjected to a magnetic flux density of 500 G. This value is more than twice the average Hall output voltage of a GaAs Hall element. The Hall output voltage variation with temperature, showed the same characteristics as with example 12. The input resistance variation with temperature also, as with example 12 showed no drop even past 150° C., and had excellent heat resistance. Hence the element can be used at the previously impossible temperatures of 100° C. to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 15

In order to obtain a Hall element utilizing the quantum effect, a first compound semiconductor layer of undoped $Al_{0.8}Ga_{0.2}As_{0.16}Sb_{0.84}$ is grown to a thickness of 1.0 μm on the surface of a two inch diameter GaAs substrate by the molecular-beam epitaxy (MBE) method. A sensor layer of undoped InAs is then grown to a thickness of 100Å on this layer. A second compound semiconductor layer of undoped $Al_{0.8}Ga_{0.2}As_{0.16}Sb_{0.84}$ is then grown to a thickness of 500Å on this layer, and then a cap layer of $GaAs_{0.16}Sb_{0.84}$ is grown on this layer to a thickness of 100Å.

This InAs thin film has an electron mobility of 14000 $cm^2/Vs$, a sheet resistance of 220Ω/unit area and an electron density of $2.03 \times 10^{18}$ $cm^{-3}$. The quantum well formed by the thin film was also verified. A Hall element was then made as follows in a similar manner to that of example 4.

The thin film and element characteristics are given later in Tables 3 and 4 respectively. As shown in Table 4, the Hall element of the fifteenth example had a large Hall output voltage of 170 mV for a rated input voltage when subjected to a magnetic flux density of 500 G. This value is more than twice the average Hall output voltage of a GaAs Hall element. The Hall output voltage variation with temperature, was similar to that of example 12, and even at over 100° C. showed excellent temperature characteristics. The input resistance variation with temperature also, as with example 12 showed no drop even past 150° C., and had excellent heat resistance. Hence the element can be used at the previously impossible temperatures of 100° C. to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 16

In order to obtain a Hall element utilizing the quantum effect, a first compound semiconductor layer of undoped $Al_{0.8}Ga_{0.2}As_{0.23}Sb_{0.77}$ is grown to a thickness of 1.0 µm on the surface of a two inch diameter GaAs substrate by the molecular-beam epitaxy (MBE) method. A sensor layer of undoped $In_{0.9}Ga_{0.1}As$ is then grown to a thickness of 150Å on this layer. A second compound semiconductor layer of undoped $Al_{0.8}Ga_{0.2}As_{0.23}Sb_{0.77}$ is then grown to a thickness of 500Å on this layer, and then a cap layer of $GaAs_{0.23}Sb_{0.77}$ is grown on this layer to a thickness of 100Å.

This $In_{0.9}Ga_{0.1}As$ thin film has an electron mobility of 14000 $cm^2/Vs$, a sheet resistance of 300Ω/unit area and an electron density of $0.99 \times 10^{18}$ $cm^{-3}$. The quantum well formed by the thin film was also verified.

A Hall element was then made as follows in a similar manner to that of example 4.

The thin film and element characteristics are given later in Tables 3 and 4 respectively.

As shown in Table 4, the Hall element of the sixteenth example has a large Hall output voltage of 215 mV for a rated input voltage when subjected to a magnetic flux density of 500 G. This value is more than twice the average Hall output voltage of a GaAs Hall element. The Hall output voltage variation with temperature, showed similar characteristics to those of example 12. The temperature dependence of the input resistance also, as with example 12 was extremely small up to approximately 150° C., with no apparent drop in resistance, suggesting excellent temperature characteristics. Due to this small variation in the input resistance with temperature change, the heat radiation coefficient of an element molded in a standard mini mold, is only approximately 2.3 mW/°C. Hence the element can be used at previously impossibly high temperatures, and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 17

In order to obtain a Hall element utilizing the quantum effect, a first compound semiconductor layer of undoped $Al_{0.8}Ga_{0.2}As_{0.32}Sb_{0.68}$ is grown to a thickness of 1.0 µm on the surface of a two inch diameter GaAs substrate by the molecular-beam epitaxy (MBE) method. A sensor layer of undoped $In_{0.8}Ga_{0.2}As$ is then grown to a thickness of 150Å on this layer. A second compound semiconductor layer of undoped $Al_{0.8}Ga_{0.2}As_{0.32}Sb_{0.68}$ is then grown to a thickness of 500Å on this layer, and then a cap layer of $GaAs_{0.32}Sb_{0.68}$ is grown on this layer to a thickness of 100Å. This $In_{0.8}Ga_{0.2}As$ thin film has an electron mobility of 13000 $cm^2/Vs$, a sheet resistance of 320Ω/unit area and an electron density of $1.00 \times 10^{18}$ $cm^{-3}$. The quantum well formed by the thin film was also verified.

A Hall element was then made as follows in a similar manner to that of example 4.

The thin film and element characteristics are given later in Tables 3 and 4 respectively.

As shown in Table 4, the Hall element of the seventeenth example has a large Hall output voltage of 205 mV for a rated input voltage when subjected to a magnetic flux density of 500 G. This value is more than twice the average Hall output voltage of a GaAs Hall element.

Figure 13:
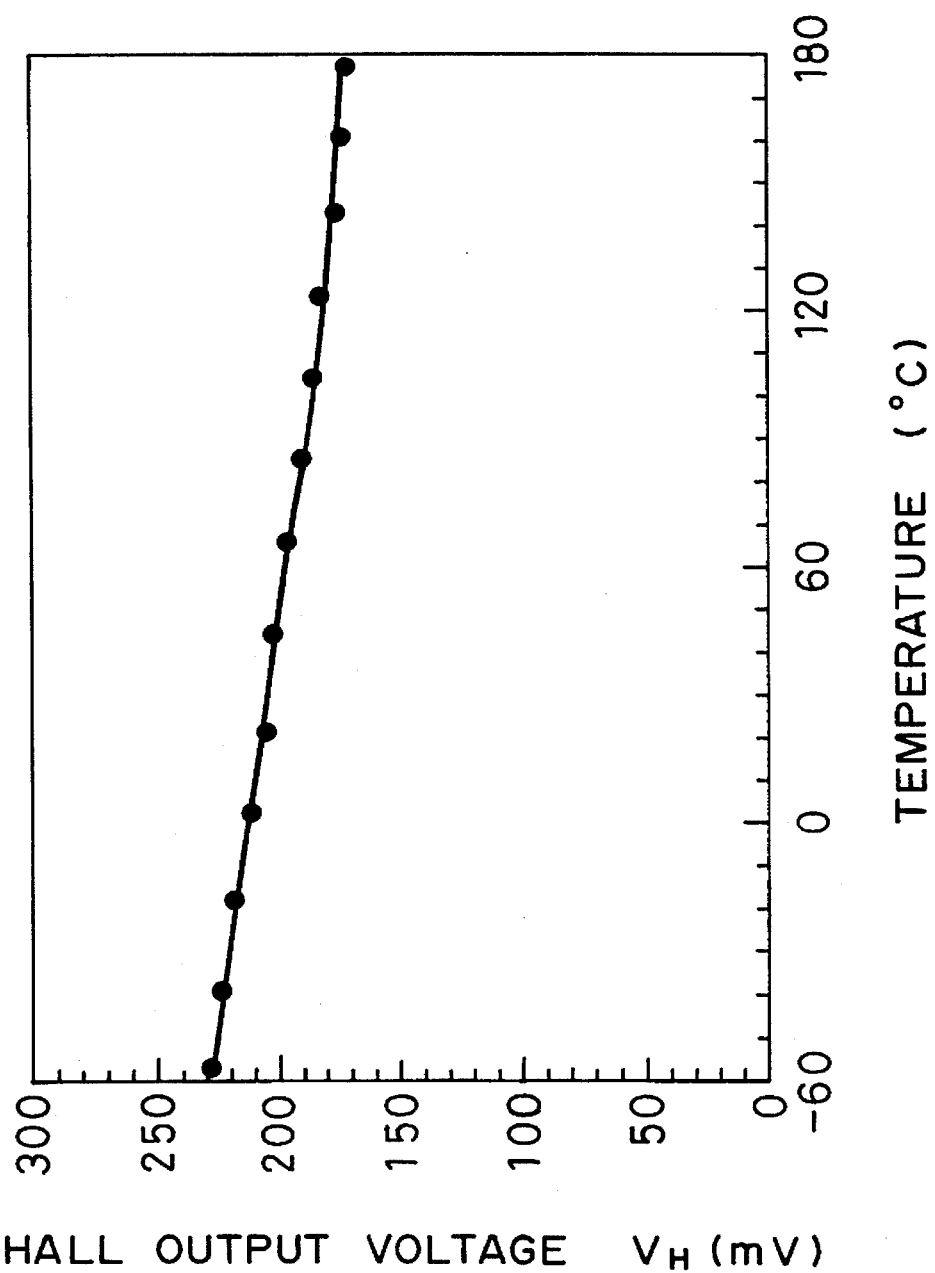
FIG. 13 is a characteristic diagram showing the temperature variation of the Hall output voltage for a seventeenth example of the present invention.
Figure 14:
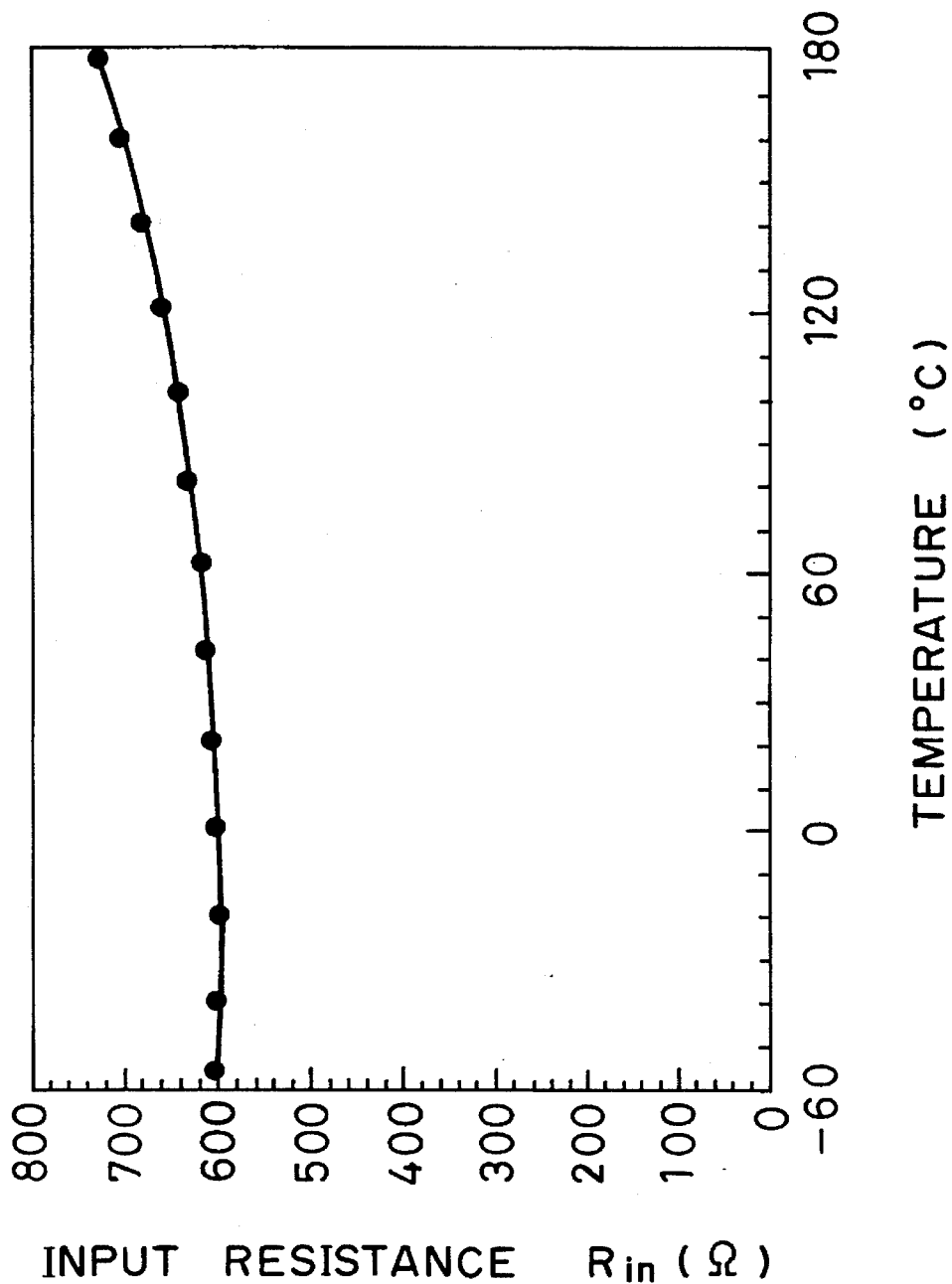
FIG. 14 is a characteristic diagram showing the temperature variation of the element resistance for the seventeenth example of the present invention.
Figure 15A:
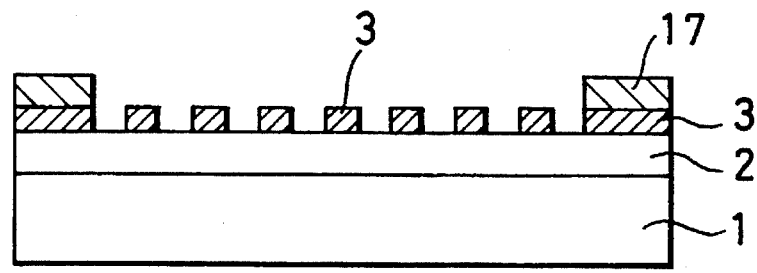
FIGS. 15A and 15B are respective sectional and plan views showing examples of semiconductor sensors according to the present invention wherein light, pressure, and strain can be detected by a resistor type element.
Figure 15B:
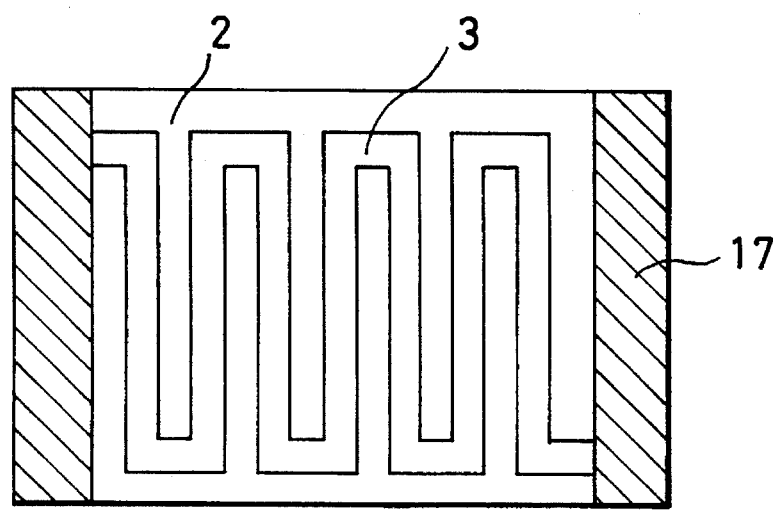
Figure 15C:
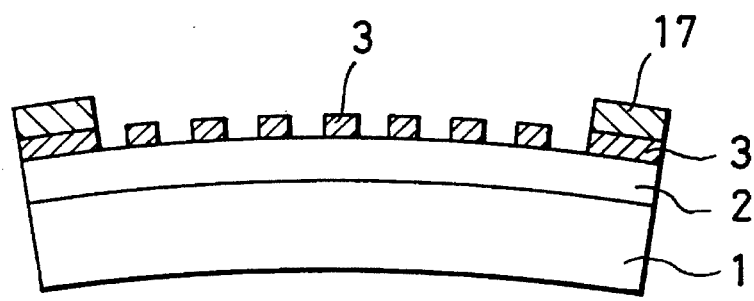
FIG. 15C is a typical view showing the sensor used as a strain sensor.
Figure 16:
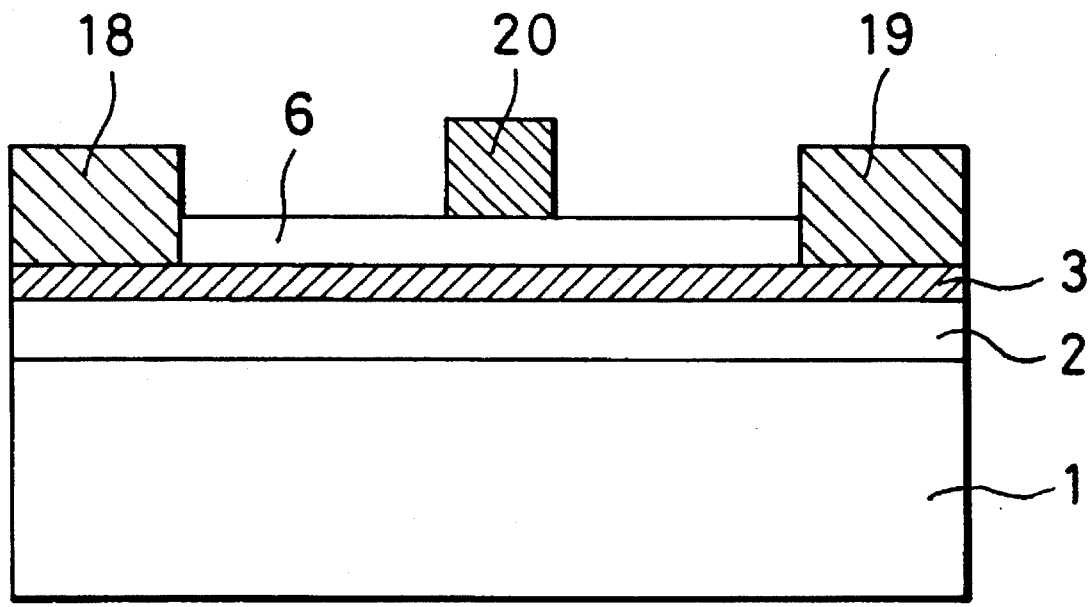
FIG. 16 is a sectional view showing an example of a semiconductor sensor according to the present invention, wherein a resistance type element semiconductor sensor has a central electrode, whereby the light, pressure and strain detection sensitivity can be adjusted.
Figure 17A:
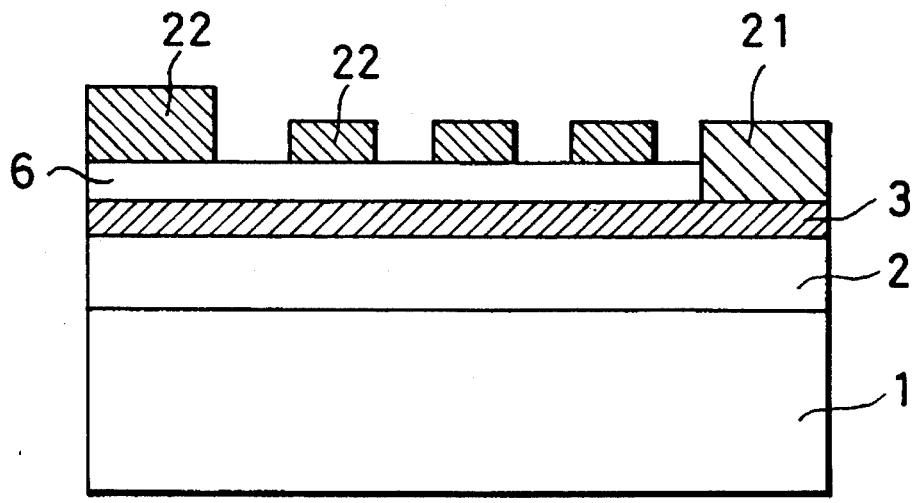
FIGS. 17A and 17B are respective sectional and plan views showing an example of a semiconductor sensor according to the present invention whereby light, pressure and strain may be detected.
Figure 17B:
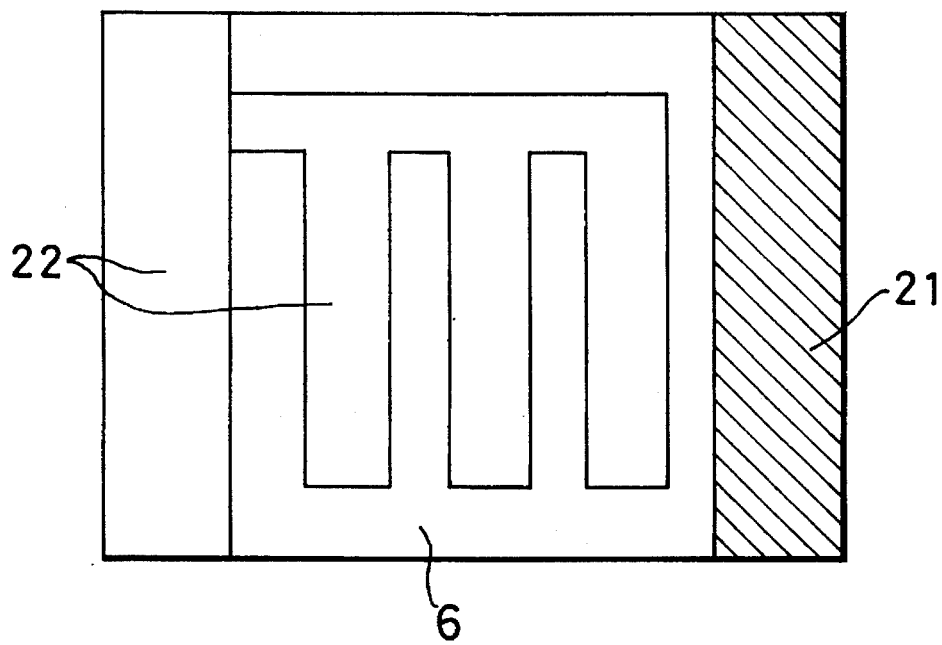
Figure 18:
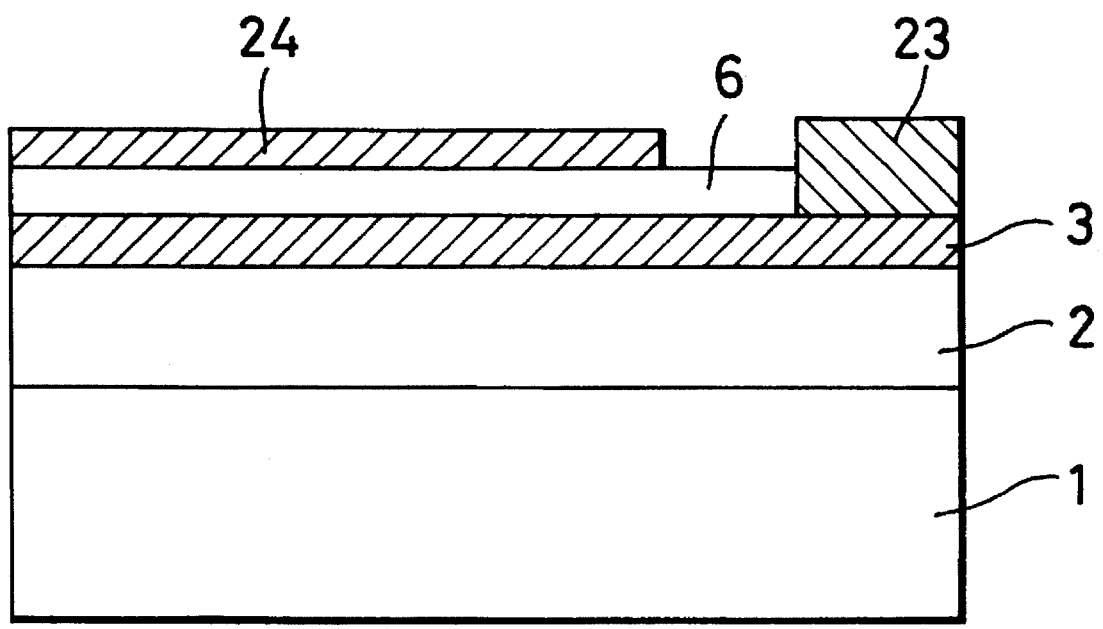
FIG. 18 is a sectional view showing an example of a semiconductor sensor according to the present invention whereby light, pressure and strain can be detected by a change in capacitance.
Figure 19A:
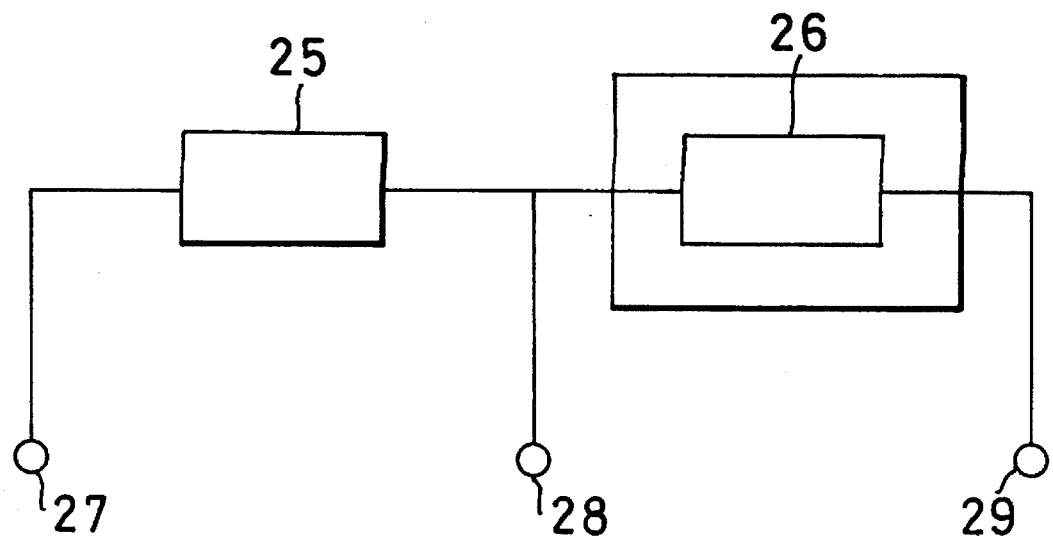
Figure 19B:
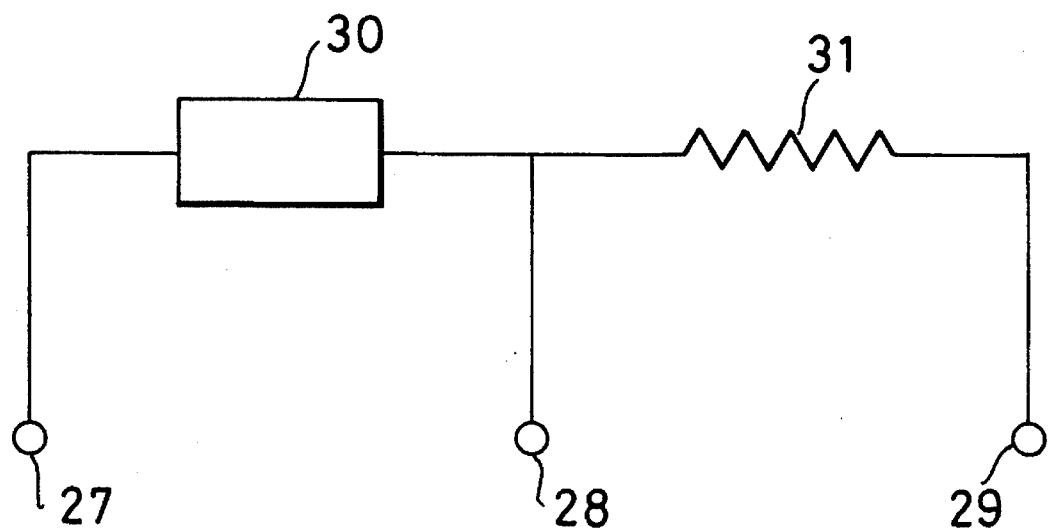

The temperature characteristics of the Hall output voltage are shown in FIG. 13. The temperature variation of the Hall output voltage at a constant voltage is small even at temperatures above 100° C. showing excellent temperature characteristics. As shown in FIG. 14, the input resistance variation with temperature shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

COMPARATIVE EXAMPLE 5

As with example 17, an undoped $Al_{0.8}Ga_{0.2}As_{0.6}Sb_{0.4}$ is grown to a thickness of 1.0 µm on the surface of a two inch diameter GaAs substrate. An undoped $In_{0.8}Ga_{0.2}$ is then grown to a thickness of 150Å. An undoped $Al_{0.8}Ga_{0.2}As_{0.6}Sb_{0.4}$ is then grown to a thickness of 500Å, and then a cap layer of $GaAs_{0.6}Sb_{0.4}$ is grown to a thickness of 100Å. The surface morphology of the growth layer showed a slight blooming. This $In_{0.8}Ga_{0.2}As$ thin film has an electron mobility of 2000 $cm^2/Vs$, a sheet resistance of 1100Ω/unit area and an electron density of $1.89 \times 10^{18}$ $cm^{-3}$. A Hall element was made by the method of example 4, however this had a Hall output voltage of only 30 mV, and an extremely high input resistance of 2.2 kΩ. Furthermore, the Hall output voltage, and input resistance were strongly dependent on temperature changes, and the input resistance dropped markedly at high temperatures.

EXAMPLE 18

In order to obtain a Hall element utilizing the quantum effect, a first compound semiconductor layer of undoped $Al_{0.8}Ga_{0.2}As_{0.45}Sb_{0.55}$ is grown to a thickness of 1.0 µm on the surface of a two inch diameter GaAs substrate by the molecular-beam epitaxy (MBE) method. A sensor layer of undoped $In_{0.65}Ga_{0.35}As$ is then grown to a thickness of 150Å on this layer. A second compound semiconductor layer of undoped $Al_{0.8}Ga_{0.2}As_{0.45}Sb_{0.55}$ is then grown to a thickness of 500Å on this layer, and then a cap layer of $GaAs_{0.45}Sb_{0.55}$ is grown on this layer to a thickness of 100Å. This $In_{0.65}Ga_{0.35}As$ thin film has an electron mobility of 14000 $cm^2/Vs$, a sheet resistance of 360Ω/unit area and an electron density of $0.83 \times 10^{18}$ $cm^{-3}$. The quantum well formed by the thin film was also verified.

A Hall element was then made as follows in a similar manner to that of example 4.

The thin film and element characteristics are given later in Tables 3 and 4 respectively.

As shown in Table 4, the Hall element of the eighteenth example had a large Hall output voltage of 205 mV for a rated input voltage when subjected to a magnetic flux density of 500 G. This value is twice the average Hall output voltage of a GaAs Hall element. The temperature variation of the Hall output voltage at a constant voltage is small even at temperatures above 100° C. showing excellent temperature characteristics. Also the input resistance variation with temperature shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C. and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 19

A first compound semiconductor layer of undoped $Al_{0.8}Ga_{0.2}As_{0.75}Sb_{0.25}$ is grown to a thickness of 1.0 µm on the surface of a two inch diameter GaAs substrate by the molecular-beam epitaxy (MBE) method. A sensor layer of undoped $In_{0.3}Ga_{0.7}As$ is then grown to a thickness of 150Å on this layer. A second compound semiconductor layer of undoped $Al_{0.8}Ga_{0.2}As_{0.75}Sb_{0.25}$ is then grown to a thickness of 500Å on this layer, and then a cap layer of $GaAs_{0.75}Sb_{0.25}$ is grown on this layer to a thickness of 100Å.

This $In_{0.3}Ga_{0.7}As$ thin film has an electron mobility of 10000 $cm^2/Vs$, a sheet resistance of 400Ω/unit area and an electron density of $1.04 \times 10^{18}$ $cm^{-3}$. The quantum well formed by the thin film was also verified.

A Hall element was then made as follows in a similar manner to that of example 4.

The thin film and element characteristics are given later in Tables 3 and 4 respectively.

As shown in Table 4, the Hall element of the nineteenth example had a large Hall output voltage of 150 mV for a rated input voltage when subjected to a magnetic flux density of 500 G. This value is more than 1.5 times the average Hall output voltage of a GaAs Hall element. The temperature variation of the Hall output voltage at a constant voltage is small even at temperatures above 100° C. showing excellent temperature characteristics. Also the input resistance variation with temperature shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 20

A first compound semiconductor layer of undoped $Al_{0.8}In_{0.2}As_{0.3}Sb_{0.7}$ is grown to a thickness of 1.0 µm on the surface of a two inch diameter GaAs substrate by the molecular-beam epitaxy (MBE) method. A sensor layer of undoped $In_{0.8}Ga_{0.2}As_{0.8}Sb_{0.2}$ is then grown to a thickness of 150Å on this layer. A second compound semiconductor layer of undoped $Al_{0.8}In_{0.2}As_{0.3}Sb_{0.7}$ is then grown to a thickness of 500Å on this layer. This $In_{0.8}Ga_{0.2}As_{0.8}Sb_{0.2}$ thin film has an electron mobility of 15000 $cm^2/Vs$, a sheet resistance of 300Ω/unit area and an electron density of $0.93 \times 10^{18}$ $cm^{-3}$. The quantum well formed by the thin film was also verified.

A Hall element was then made as follows in a similar manner to that of example 9.

The thin film and element characteristics are given later in Tables 3 and 4 respectively.

As shown in Table 4, the Hall element of the twentieth example had a large Hall output voltage of 210 mV for a rated input voltage when subjected to a magnetic flux density of 500 G. This value is more than twice the average Hall output voltage of a GaAs Hall element. The Hall output voltage variation with temperature, like example 17 was small, and the input resistance variation with temperature also, as with example 17 shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

COMPARATIVE EXAMPLE 6

As with example 20, an undoped $Al_{0.8}In_{0.2}As_{0.7}Sb_{0.3}$ is grown to a thickness of 1.0 µm. An undoped $In_{0.8}Ga_{0.2}As_{0.8}Sb_{0.2}$ is then grown to a thickness of 150Å. An undoped $Al_{0.8}In_{0.2}As_{0.7}Sb_{0.3}$ is then grown to a thickness of 500Å. The grown thin film had a very poor surface morphology, a very high sheet resistance of 1050Ω, and an electron mobility of 2200 $cm^2/Vs$. A Hall element was made the method of example 9 and the element characteristics measured. The Hall output voltage was only 30 mV, with a very high input resistance of 2.1 kΩ. Furthermore, the Hall output voltage, and input resistance were strongly dependent on temperature changes, and the input resistance dropped markedly at high temperatures.

EXAMPLE 21

A first compound semiconductor layer of undoped $Al_{0.8}In_{0.2}As_{0.05}Sb_{0.95}$ is grown to a thickness of 1.0 μm on the surface of a two inch diameter GaAs substrate by the molecular-beam epitaxy (MBE) method. A sensor layer of undoped $In_{0.8}Ga_{0.2}As_{0.5}Sb_{0.5}$ is then grown to a thickness of 150Å on this layer. A second compound semiconductor layer of undoped $Al_{0.8}In_{0.2}As_{0.05}Sb_{0.95}$ is then grown to a thickness of 500Å on this layer. This $In_{0.8}Ga_{0.2}As_{0.5}Sb_{0.5}$ thin film has an electron mobility of 15000 cm$^2$/Vs, a sheet resistance of 290Ω/unit area and an electron density of $0.96 \times 10^{18}$ cm$^{-3}$. The quantum well formed by the thin film was also verified.

A Hall element was then made as follows in a similar manner to that of example 9.

The thin film and element characteristics are given later in Tables 3 and 4 respectively.

As shown in Table 4, the Hall element of the twenty first example had a large Hall output voltage of 215 mV for a rated input voltage when subjected to a magnetic flux density of 500 G. This value is more than twice the average Hall output voltage of a GaAs Hall element. The Hall output voltage variation with temperature, like example 17 was small, and the input resistance variation with temperature also, as with example 17 shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 22

A first compound semiconductor layer of undoped $Al_{0.4}In_{0.6}As_{0.05}Sb_{0.95}$ is grown to a thickness of 1.0 μm on the surface of a two inch diameter GaAs substrate by the molecular-beam epitaxy (MBE) method. A sensor layer of undoped $In_{0.8}Ga_{0.2}As_{0.2}Sb_{0.8}$ is then grown to a thickness of 150Å on this layer. A second compound semiconductor layer of undoped $Al_{0.4}In_{0.6}As_{0.05}Sb_{0.95}$ is then grown to a thickness of 500Å on this layer. This $In_{0.8}Ga_{0.2}As_{0.2}Sb_{0.8}$ thin film has an electron mobility of 16000 cm$^2$/Vs, a sheet resistance of 270Ω/unit area and an electron density of $0.96 \times 10^{18}$ cm$^{-3}$. The quantum well formed by the thin film was also verified.

A Hall element was then made as follows in a similar manner to that of example 9.

The thin film and element characteristics are given later in Tables 3 and 4 respectively.

As shown in Table 4, the Hall element of the twenty second example had a large Hall output voltage of 230 mV for a rated input voltage when subjected to a magnetic flux density of 500 G. This value is more than twice the average Hall output voltage of a GaAs Hall element. The Hall output voltage variation with temperature, like example 17 was small, and the input resistance variation with temperature also, as with example 17 shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 23

A first compound semiconductor layer of undoped $Al_{0.8}Ga_{0.2}As_{0.16}Sb_{0.84}$ is grown to a thickness of 1.0 μm on the surface of a two inch diameter GaAs substrate by the molecular-beam epitaxy (MBE) method. Then only the Sb was irradiated to grow a single atom layer. The Sb irradiation was then stopped and immediately irradiation of only the In commenced to grow a single atom layer, and this was followed by irradiation of the As. Then a sensor layer of undoped InAs was grown to a thickness of 150Å on this layer. Subsequently, the process was repeated with irradiation of only the In to grow a single atom layer. The In irradiation was then stopped and immediately irradiation of only the Sb commenced to grow a single atom layer. On completion of the single atom layer of Sb, a second compound semiconductor layer of undoped $Al_{0.8}Ga_{0.2}As_{0.16}Sb_{0.84}$ is then grown to a thickness of 500Å on this layer, and then a cap layer of $GaAs_{0.16}Sb_{0.84}$ is grown on this layer to a thickness of 100Å. This InAs thin film has an electron mobility of 21000 cm$^2$/Vs, a sheet resistance of 205Ω/unit area and an electron density of $0.97 \times 10^{18}$ cm$^{-3}$. An In—Sb type bond was formed at the interface between the InAs layer and the $Al_{0.8}Ga_{0.2}As_{0.16}Sb_{0.84}$ layer resulting in a significant increase in electron mobility.

A Hall element was then made as follows in a similar manner to that of example 4.

The thin film and element characteristics are given later in Tables 3 and 4 respectively.

As shown in Table 4, the Hall element of the twenty third example had a large Hall output voltage of 260 mV for a rated input voltage when subjected to a magnetic flux density of 500 G. This value is more than three times the average Hall output voltage of a GaAs Hall element. The Hall output voltage temperature characteristics, like example 12, showed good temperature characteristics even at temperatures above 100° C. The input resistance variation with temperature also, as with example 12 shows no drop up to approximately 150° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 150° C., and even at low temperatures down to −50° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

EXAMPLE 24

A first compound semiconductor layer of undoped $Al_{0.8}Ga_{0.2}As_{0.32}Sb_{0.68}$ is grown to a thickness of 1.0 μm on the surface of a two inch diameter GaAs substrate by the molecular-beam epitaxy (MBE) method. Then only the Sb was irradiated to grow a single atom layer. The Sb irradiation was then stopped and immediately irradiation of only the In commenced to grow a single atom layer, and this was followed by irradiation of the As and Ga. Then a sensor layer of undoped $In_{0.8}Ga_{0.2}As$ was grown to a thickness of 150Å on this layer. Subsequently, the process was repeated with irradiation of only the In to grow a single atom layer. The In irradiation was then stopped and immediately irradiation of only the Sb commenced to grow a single atom layer. On completion of the single atom layer of Sb, a second compound semiconductor layer of undoped $Al_{0.8}Ga_{0.2}As_{0.32}Sb_{0.68}$ is then grown to a thickness of 500Å on this layer, and then a cap layer of $GaAs_{0.32}Sb_{0.68}$ is grown on this layer to a thickness of 100Å. This $In_{0.8}Ga_{0.2}As$ thin film has an electron mobility of 16000 cm$^2$/Vs, a sheet resistance of 300Ω/unit area and an electron density of $0.87 \times 10^{18}$ cm$^{-3}$. An In—Sb type bond was formed at the interface between the $In_{0.8}Ga_{0.2}As$ layer and the $Al_{0.8}Ga_{0.2}As_{0.32}Sb_{0.68}$ layer resulting in a significant increase in electron mobility.

A Hall element was then made as follows in a similar manner to that of example 4.

The thin film and element characteristics are given later in Tables 3 and 4 respectively.

As shown in Table 4, the Hall element of the twenty fourth example had a large Hall output voltage of 225 mV for a rated input voltage when subjected to a magnetic flux density of 500 G. This value is more than twice the average Hall output voltage of a GaAs Hall element. The Hall output voltage temperature characteristics, like example 17, showed good temperature characteristics even at temperatures above 100° C. The input resistance variation with temperature also, as with example 17 shows no drop up to approximately 180° C., indicating excellent temperature characteristics. Furthermore, the heat radiation coefficient of an element molded in a standard mini mold, is only approximately 2.3 mW/°C. Hence the element can be used at the previously impossible temperatures of 100° C. to 180° C., and even at low temperatures down to −60° C. no problems are experienced. The element is thus reliable for use over a wide range of temperatures. With the Hall element as one of the magnetic sensors of the present invention, the Hall output voltage in the magnetic field is large resulting in high sensitivity. The Hall element can also be used at high temperatures, and reliability is extremely high.

The above resulted are tabulated in the following Tables 1 to 4. Tables 2 and 4 grade temperature characteristics as A, B and C. Grade A indicated excellent temperature characteristics with no drop in the input resistance even at high temperatures. Grade B indicates good temperature characteristics, which although showing a slight drop in input resistance at high temperature, in practice this drop is not enough to be a problem. Grade C indicates a large drop in input resistance in the high temperature region, which in practice would present a problem.

TABLE 1

| Example No. | Sensor layer composition and thickness | (Å) | Second compound semiconductor layer | Film characteristics | | |
|---|---|---|---|---|---|---|
| | | | | Mobility cm$^2$/Vs | Sheet resistance (Ω) | Electron density ($\times 10^{17}$ cm$^{-3}$) |
| 1-a | Silicon doped(Si—)InAs | 2500 | No | 19000 | 150 | 0.88 |
| 1-b | Non-doped InAs | 2500 | No | 12000 | 520 | 0.40 |
| 2 | Si—InAs | 1500 | No | 19000 | 230 | 0.95 |
| 3 | Si—InAs | 1000 | No | 19000 | 300 | 1.10 |
| Comparative example 1 | Mismatched Si—InAs | 1000 | No | measurement not possible | | — |
| 4 | Si—InAs | 1000 | Yes | 21000 | 280 | 1.10 |
| 5 | Si—$In_{0.8}Ga_{0.2}As$ | 1000 | No | 15500 | 330 | 1.22 |
| Comparative Example 2 | Mismatched Si—$In_{0.8}Ga_{0.2}As$ | 1000 | Yes | measurement not possible | | — |
| 6 | Si—$In_{0.8}Ga_{0.2}As$ | 1000 | Yes | 19000 | 310 | 1.06 |
| 7 | Si—$In_{0.65}Ga_{0.35}As$ | 1000 | Yes | 13000 | 380 | 1.26 |
| 8 | Si—$In_{0.3}Ga_{0.7}As$ | 1000 | Yes | 9000 | 420 | 1.65 |
| 9 | Si—$In_{0.8}Ga_{0.2}As_{0.8}Sb_{0.2}$ | 1000 | Yes | 20000 | 270 | 1.10 |
| Comparative Example 3 | Mismatched Si—$In_{0.8}Ga_{0.2}As_{0.8}Sb_{0.2}$ | 1000 | Yes | measurement not possible | | — |
| 10 | Si—$In_{0.8}Ga_{0.2}As_{0.5}Sb_{0.5}$ | 1000 | Yes | 21000 | 270 | 1.10 |
| 11 | Si—$In_{0.8}Ga_{0.2}As_{0.2}Sb_{0.8}$ | 1000 | Yes | 21000 | 250 | 1.19 |

TABLE 2

| Example No. | Sensor layer composition and thickness | (Å) | Second compound semiconductor layer | Hall element characteristics | | | |
|---|---|---|---|---|---|---|---|
| | | | | Hall output volts $V_H$ (mV/500G6V) | $R_{in}$ (Ω) | Offset volts $V_u$ (mV/0G6V) | Temperature characteristics |
| 1-a | Silicon doped (Si—)InAs | 2500 | No | 210 | 375 | 1.20 ± 0.40 | A |
| 1-b | Non-doped InAs | 2500 | No | 150 | 1100 | as above | B |
| 2 | Si—InAs | 1500 | No | 260 | 460 | as above | A |
| 3 | Si—InA | 1000 | No | 270 | 580 | as above | A |
| Comparative example 1 | Mismatched Si—InAs | 1000 | No | element not possible | | — | — |

TABLE 2-continued

| Example No. | Sensor layer composition and thickness | (Å) | Second compound semiconductor layer | Hall output volts $V_H$ (mV/500G6V) | $R_{in}$ ($\Omega$) | Offset volts $V_u$ (mV/0G6V) | Temperature characteristics |
|---|---|---|---|---|---|---|---|
| 4 | Si—InAs | 1000 | Yes | 309 | 560 | $1.20 \pm 0.40$ | A |
| 5 | Si—In$_{0.8}$Ga$_{0.2}$As | 1000 | No | 200 | 650 | as above | A |
| Comparative example 2 | Mismatched Si—In$_{0.8}$Ga$_{0.2}$As | 1000 | No | element not possible | — | — | — |
| 6 | Si—In$_{0.8}$Ga$_{0.2}$As | 1000 | Yes | 240 | 640 | $1.20 \pm 0.40$ | A |
| 7 | Si—In$_{0.65}$Ga$_{0.35}$As | 1000 | Yes | 195 | 750 | as above | A |
| 8 | Si—In$_{0.3}$Ga$_{0.7}$As | 1000 | Yes | 140 | 840 | as above | A |
| 9 | Si—In$_{0.8}$Ga$_{0.2}$As$_{0.8}$Sb$_{0.2}$ | 1000 | Yes | 300 | 540 | as above | A |
| Comparative example 3 | Mismatched Si—In$_{0.8}$Ga$_{0.2}$As$_{0.8}$Sb$_{0.2}$ | 1000 | Yes | element possible | — | — | — |
| 10 | Si—In$_{0.8}$Ga$_{0.2}$As$_{0.5}$Sb$_{0.5}$ | 1000 | Yes | 310 | 530 | $1.20 \pm 0.40$ | A |
| 11 | Si—In$_{0.8}$Ga$_{0.2}$As$_{0.2}$Sb$_{0.8}$ | 1000 | Yes | 305 | 525 | as above | A |

TABLE 3

| Example No. | Sensor layer composition and thickness | (Å) | Second compound semiconductor layer | Film characteristics | | |
|---|---|---|---|---|---|---|
| | | | | Mobility cm$^2$/Vs | Sheet resistance $\Omega$ | Electron density ($\times 10^{17}$ cm$^{-3}$) |
| 12 | InAs | 150 | Yes | 15000 | 200 | 13.9 |
| Comparative example 4 | Mismatched InAs | 150 | Yes | 2300 | 1030 | 17.5 |
| 13 | InAs | 200 | Yes | 15000 | 215 | 9.70 |
| 14 | InAs | 300 | Yes | 15000 | 250 | 5.60 |
| 15 | InAs | 100 | Yes | 14000 | 220 | 20.3 |
| 16 | In$_{0.9}$Ga$_{0.1}$As | 150 | Yes | 14000 | 300 | 9.90 |
| 17 | In$_{0.8}$Ga$_{0.2}$As | 150 | Yes | 13000 | 320 | 10.0 |
| Comparative example 5 | Mismatched In$_{0.8}$Ga$_{0.2}$As | 150 | Yes | 2000 | 1100 | 18.9 |
| 18 | In$_{0.65}$Ga$_{0.35}$As | 150 | Yes | 14000 | 360 | 8.30 |
| 19 | In$_{0.3}$Ga$_{0.7}$As | 150 | Yes | 10000 | 400 | 10.4 |
| 20 | In$_{0.8}$Ga$_{0.2}$As$_{0.8}$Sb$_{0.2}$ | 150 | Yes | 15000 | 300 | 9.30 |
| Comparative example 6 | Mismatched In$_{0.8}$Ga$_{0.2}$As$_{0.8}$Sb$_{0.2}$ | 150 | Yes | 2200 | 1050 | 18.0 |
| 21 | In$_{0.8}$Ga$_{0.2}$As$_{0.5}$Sb$_{0.5}$ | 150 | Yes | 15000 | 290 | 9.60 |
| 22 | In$_{0.8}$Ga$_{0.2}$As$_{0.2}$Sb$_{0.8}$ | 150 | Yes | 16000 | 270 | 9.60 |
| 23 | InAs InSb interface | 150 | Yes | 21000 | 205 | 9.70 |
| 24 | In$_{0.8}$Ga$_{0.2}$As InSb interface | 150 | Yes | 16000 | 300 | 8.70 |

TABLE 4

| Example No | Sensor layer composition and thickness | (Å) | Second compound semiconductor layer | Hall output volts $V_H$ (mV/500G6V) | $R_{in}$ ($\Omega$) | Offset volts $V_u$ (mV/0G6V) | Temperature characteristics |
|---|---|---|---|---|---|---|---|
| 12 | InAs | 150 | Yes | 220 | 400 | $1.2 \pm 0.40$ | A |
| Comparative example 4 | Mismatched InAs | 150 | Yes | 35 | 2000 | $5.00 \pm 0.40$ | C |
| 13 | InAs | 200 | Yes | 225 | 430 | $1.20 \pm 0.40$ | A |
| 14 | InAs | 300 | Yes | 210 | 500 | as above | A |
| 15 | InAs | 100 | Yes | 170 | 440 | as above | A |
| 16 | In$_{0.9}$Ga$_{0.1}$As | 150 | Yes | 215 | 600 | as above | A |
| 17 | In$_{0.9}$Ga$_{0.2}$As | 150 | Yes | 205 | 620 | as above | A |
| Comparative example 5 | Mismatched In$_{0.8}$Ga$_{0.2}$As | 150 | Yes | 30 | 2200 | $5.00 \pm 0.40$ | C |
| 18 | In$_{0.65}$Ga$_{0.35}$As | 150 | Yes | 205 | 700 | $1.20 \pm 0.40$ | A |
| 19 | In$_{0.3}$Ga$_{0.7}$As | 150 | Yes | 150 | 800 | as above | A |
| 20 | In$_{0.8}$Ga$_{0.2}$As$_{0.8}$Sb$_{0.2}$ | 150 | Yes | 210 | 600 | as above | A |
| Comparative example 6 | Mismatched In$_{0.8}$Ga$_{0.2}$As$_{0.8}$Sb$_{0.2}$ | 150 | Yes | 30 | 2100 | $5.0 \pm 0.40$ | C |
| 21 | In$_{0.8}$Ga$_{0.2}$As$_{0.5}$Sb$_{0.5}$ | 150 | Yes | 215 | 580 | $1.20 \pm 0.40$ | A |
| 22 | In$_{0.8}$Ga$_{0.2}$As$_{0.2}$Sb$_{0.8}$ | 150 | Yes | 230 | 540 | as above | A |
| 23 | InAs InSb interface | 150 | Yes | 260 | 410 | as above | A |
| 24 | In$_{0.8}$Ga$_{0.2}$As InSb interface | 150 | Yes | 225 | 610 | as above | A |

Examples of the present invention are given above. However the present invention is not limited to these examples.

Furthermore, there are many other examples of the present invention based on these, and the present invention extends to all these various possible applications.

INDUSTRIAL FIELD OF APPLICATION

The semiconductor sensor of the present invention as described above, when used as a magnetic sensor achieves previously unattainable high sensitivity and high output. Moreover, the process of growing the thin film and forming the element is suitable for mass production, with beneficial application to engineering. Also, with the good crystallization $In_xGa_{1-x}As_ySb_{1-y}$ wherein ($0<x\leq1.0$, $0\leq y\leq1.0$) as a magnetically sensitive portion, the temperature dependence of the magnetic sensor output and of the input resistance are both small. Moreover, since the drop in the input resistance at high temperatures is small, the element has high heat resistance and high breakdown voltage, so that it may be used over a wide temperature range with high reliability. Hence the element is suitable for a wide range of uses that were not heretofore possible, opening up many new industrial applications.

Moreover, the semiconductor sensor of the present invention, when used as an optical sensor utilizes the high electron mobility of the sensor layer to give a high speed response. Furthermore, since the dark current of the element is small, it shows promise for use as an optical sensor for detection in the mid-infrared range (2–8 μm). Also, by utilizing the small band gap of the sensor layer a highly sensitive pressure or strain sensor is possible for detecting pressure or strain in a wide field of applications.

We claim:

1. A magnetic sensor, comprising:

a first compound semiconductor layer having a high resistance;

an InAs thin film layer grown on said first compound semiconductor layer; and an electrode formed on said InAs thin film layer, wherein said first compound semiconductor layer has a different composition from said InAs thin film layer, the composition of said first compound semiconductor layer being predetermined so as to match a lattice of said first compound semiconductor layer with that of said InAs thin film layer to thereby have a lattice constant the same as or nearly the same as that of said InAs thin film layer, and wherein said first compound semiconductor layer has a band gap energy greater than that of the InAs thin film layer.

2. A magnetic sensor, comprising:

a first compound semiconductor layer having a high resistance;

a thin film layer of $In_xGa_{1-x}As$ ($0<x<1.0$) grown on said first compound semiconductor layer; and an electrode formed on said $In_xGa_{1-x}As$ thin film layer, wherein said first compound semiconductor layer has a different composition from said $In_xGa_{1-x}As$ thin film layer the composition of said first compound semiconductor layer being predetermined so as to match a lattice of said first compound semiconductor layer with that of said $In_xGa_{1-x}As$ thin film layer to thereby have a lattice constant the same as or nearly the same as that of the $In_xGa_{1-x}As$ thin film layer and wherein said first compound semiconductor layer has a band gap energy greater than that of the $In_xGa_{1-x}As$ thin film layer 3. A magnetic sensor, comprising a high resistance first compound semiconductor layer, a thin film layer of $In_xGa_{1-x}As_ySb_{1-y}$ ($0<x\leq1.0$, $0\leq y<1.0$) grown on said first compound semiconductor layer, and an electrode formed on said $In_xGa_{1-x}As_ySb_{1-y}$ thin film layer, wherein said first compound semiconductor layer has a lattice constant the same as or nearly the same as that of the $In_xGa_{1-x}As_ySb_{1-y}$, and a band gap energy greater than that of the $In_xGa_{1-x}As_ySb_{1-y}$.

4. A magnetic sensor as claimed in claim 1, wherein said InAs thin film layer has a film thickness of not more than 500Å.

5. A magnetic sensor as claimed in claim 2, wherein said $In_xGa_{1-x}As$ thin film layer has a thickness of not more than 500Å.

6. A magnetic sensor as claimed in claim 3, wherein said $In_xGa_{1-x}As_ySb_{1-y}$ layer has a thickness of not more than 500Å.

7. A magnetic sensor as claimed in claim 1 or 4, wherein an electron density of said InAs layer is within the range of from $5\times10^{16}$ to $8\times10^{18}/cm^3$.

8. A magnetic sensor as claimed in claim 7, wherein said first compound semiconductor layer is doped with a donor impurity.

9. A magnetic sensor as clammed in claim 2 or 5, wherein an electron density of said $In_xGa_{1-x}As$ layer is within the range of from $5\times10^{16}$ to $8\times10^{18}/cm^3$.

10. A magnetic sensor as claimed in claim 9, wherein said first compound semiconductor layer is doped with a donor impurity.

11. A magnetic sensor as claimed in claim 3 or 6, wherein an electron density of said $In_xGa_{1-x}As_ySb_{1-y}$ layer is within the range of from $5\times10^{16}$ to $8\times10^{18}/cm^3$.

12. A magnetic sensor as claimed in claim 11, wherein said first compound semiconductor layer is doped with a donor impurity.

13. A magnetic sensor as claimed in any one of claims 1 and 6, wherein said first compound semiconductor layer is doped with a donor impurity.

14. A magnetic sensor as claimed in claim 1, wherein a high resistance second compound semiconductor layer is formed on the InAs layer and said second compound semiconductor layer has a lattice constant the same as or nearly the same as that of InAs, and a band gap energy greater than that of InAs.

15. A magnetic sensor as claimed in claim 2, wherein a high resistance second compound semiconductor layer is formed on the $In_xGa_{1-x}As$ layer and said second compound semiconductor layer has a lattice constant the same as or nearly the same as that of $In_xGa_{1-x}As$, and a band gap energy greater than that of $In_xGa_{1-x}As$.

16. A magnetic sensor as claimed in claim 3, wherein a high resistance second compound semiconductor layer is formed on the $In_xGa_{1-x}As_ySb_{1-y}$ layer and said second compound semiconductor layer has a lattice constant the same as or nearly the same as that of $In_xGa_{1-x}As_ySb_{1-y}$, and a band gap energy greater than that of $In_xGa_{1-x}As_ySb_{1-y}$.

17. A magnetic sensor as claimed in claim 14, wherein said InAs thin film layer has a film thickness of not more than 500Å.

18. A magnetic sensor as claimed in claim 15, wherein said $In_xGa_{1-x}As$ thin film layer has a thickness of not more than 500Å.

19. A magnetic sensor as claimed in claim 16, wherein said $In_xGa_{1-x}As_ySb_{1-y}$ layer has a thickness of not more than 500Å.

20. A magnetic sensor as claimed in claim 14 or 17, wherein an electron density of said InAs layer is within the range of from $5\times10^{16}$ to $8\times10^{18}/cm^3$.

21. A magnetic sensor as claimed in claim 20, wherein either one or both of said first compound semiconductor layer and said second compound semiconductor layer is doped with a donor impurity.

22. A magnetic sensor as claimed in claim 15 or 18, wherein an electron density of said $In_xGa_{1-x}As$ layer is within the range of from $5\times10^{16}$ to $8\times10^{18}/cm^3$.

23. A magnetic sensor as claimed in claim 22, wherein either one or both of said first compound semiconductor layer and said second compound semiconductor layer is doped with a donor impurity.

24. A magnetic sensor as claimed in claim 16 or 19, wherein an electron density of said $In_xGa_{1-x}As_ySb_{1-y}$ layer is within the range of from $5\times10^{16}$ to $8\times10^{18}/cm^3$.

25. A magnetic sensor as claimed in claim 24, wherein either one or both of said first compound semiconductor layer and said second compound semiconductor layer is doped with a donor impurity.

26. A magnetic sensor as claimed in any one of claims 14 through 19, wherein either one or both of said first compound semiconductor layer and said second compound semiconductor layer is doped with a donor impurity.

27. A method for producing a magnetic sensor comprising the steps of;
forming a high resistance first compound semiconductor layer having a lattice constant the same as or nearly the same as that of InAs, and a band gap energy greater than that of InAs,
forming a layer of InAs on said layer,
treating said InAs layer, and
forming a plurality of ohmic electrodes on said InAs layer.

28. A method for producing a magnetic sensor comprising the steps of;
forming a high resistance first compound semiconductor layer having a lattice constant the same as or nearly the same as that of InAs, and a band gap energy greater than that of $In_xGa_{1-x}As$,
forming a layer of $In_xGa_{1-x}As$ (0<x<1.0) on said layer,
treating said $In_xGa_{1-x}As$ layer, and
forming a plurality of ohmic electrodes on said $In_xGa_{1-x}As$ layer.

29. A method for producing a magnetic sensor comprising the steps of;
forming a high resistance first compound semiconductor layer having a lattice constant the same as or nearly the same as that of $In_xGa_{1-x}As_ySb_{1-y}$, and a band gap energy greater than that of $In_xGa_{1-x}As_ySb_{1-y}$,
forming a layer of $In_xGa_{1-x}As_ySb_{1-y}$ ($0<x\leq1.0$, $0\leq y<1.0$) on said layer,
treating said $In_xGa_{1-x}As_ySb_{1-y}$ layer, and
forming a plurality of ohmic electrodes on said $In_xGa_{1-x}As_ySb_{1-y}$ layer.

30. A method of producing a magnetic sensor as claimed in claim 27, further comprising a step of forming a high resistance second compound semiconductor layer having a lattice constant the same as or nearly the same as that of InAs, and a band gap energy greater than that of InAs, on said InAs layer.

31. A method of producing a magnetic sensor as claimed in claim 28, further comprising a step of forming a high resistance second compound semiconductor layer having a lattice constant the same as or nearly the same as that of $In_xGa_{1-x}As$, and a band gap energy greater than that of $In_xGa_{1-x}As$, on said $In_xGa_{1-x}As$ layer.

32. A method of producing a magnetic sensor as claimed in claim 29, further comprising a step of forming a high resistance second compound semiconductor layer having a lattice constant the same as or nearly the same as that of $In_xGa_{1-x}As_ySb_{1-y}$, and a band gap energy greater than that of $In_xGa_{1-x}As_ySb_{1-y}$, on said $In_xGa_{1-x}As_ySb_{1-y}$ layer.

33. A hybrid magnetic sensor wherein a magnetic sensor comprising a high resistance first compound semiconductor layer in that, a thin film layer of $In_xGa_{1-x}As_ySb_{1-y}$ ($0<x\leq1.0$, $0\leq y\leq1.0$) grown on said first compound semiconductor layer, and an electrode formed on said $In_xGa_{1-x}As_ySb_{1-y}$ thin film layer, wherein said first compound semiconductor layer has a lattice constant the same as or nearly the same as that of the $In_xGa_{1-x}As_ySb_{1-y}$, and a band gap energy greater than that of the $In_xGa_{1-x}As_ySb_{1-y}$, and a silicon monolithic integrated circuit chip are molded together in the same package.

34. A magnetic sensor as claimed in claim 33, wherein a second compound semiconductor layer is formed on the $In_xGa_{1-x}As_ySb_{1-y}$ layer, and said second compound semiconductor layer has a lattice constant the same as or nearly the same as that of $In_xGa_{1-x}As_ySb_{1-y}$, and a band gap energy greater than that of $In_xGa_{1-x}As_ySb_{1-y}$.

35. A semiconductor optical sensor comprising a high resistance first compound semiconductor layer, a thin film layer of $In_xGa_{1-x}As_ySb_{1-y}$ ($0<x\leq1.0$, $0\leq y\leq1.0$) grown on said first compound semiconductor layer, and an electrode for detecting light formed on said $In_xGa_{1-x}As_ySb_{1-y}$ thin film layer, wherein said first compound semiconductor layer has a lattice constant the same as or nearly the same as that of the $In_xGa_{1-x}As_ySb_{1-y}$, and a band gap energy greater than that of the $In_xGa_{1-x}As_ySb_{1-y}$.

36. A semiconductor optical sensor as claimed in claim 35, wherein a high resistance second compound semiconductor layer is formed on the $In_xGa_{1-x}As_ySb_{1-y}$ layer, and said second compound semiconductor layer has a lattice constant the same as or nearly the same as that of $In_xGa_{1-x}As_ySb_{1-y}$, and a band gap energy greater than that of $In_xGa_{1-x}As_ySb_{1-y}$.

37. A semiconductor pressure sensor comprising a high resistance first compound semiconductor layer, a thin film layer of $In_xGa_{1-x}As_ySb_{1-y}$ ($0<x\leq1.0$, $0\leq y\leq1.0$) grown on said first compound semiconductor layer, and an electrode for detecting pressure formed on said $In_xGa_{1-x}As_ySb_{1-y}$ thin film layer, wherein said first compound semiconductor layer has a lattice constant the same as or nearly the same as that of the $In_xGa_{1-x}As_ySb_{1-y}$, and a band gap energy greater than that of the $In_xGa_{1-x}As_ySb_{1-y}$.

38. A semiconductor pressure sensor as claimed in claim 37, wherein a high resistance second compound semiconductor layer is formed on the $In_xGa_{1-x}As_ySb_{1-y}$ layer, and said second compound semiconductor layer has a lattice constant the same as or nearly the same as that of $In_xGa_{1-x}As_ySb_{1-y}$, and a band gap energy greater than that of $In_xGa_{1-x}As_ySb_{1-y}$.

39. A semiconductor strain sensor comprising a high resistance first compound semiconductor layer, a thin film layer of $In_xGa_{1-x}As_ySb_{1-y}$ ($0<x\leq1.0$, $0\leq y\leq1.0$) grown on said first compound semiconductor layer, and an electrode for detecting strain formed on said $In_xGa_{1-x}As_ySb_{1-y}$ thin film layer, wherein said first compound semiconductor layer has a lattice constant the same as or nearly the same as that of the $In_xGa_{1-x}As_ySb_{1-y}$, and a band gap energy greater than that of the $In_xGa_{1-x}As_ySb_{1-y}$.

40. A semiconductor strain sensor as claimed in claim 39, wherein a high resistance second compound semiconductor layer is formed on the $In_xGa_{1-x}As_ySb_{1-y}$ layer, and said second compound semiconductor layer has a lattice constant the same as or nearly the same as that of $In_xGa_{1-x}As_ySb_{1-y}$, and a band gap energy greater than that of $In_xGa_{1-x}As_ySb_{1-y}$.

* * * * *

UNITED STATES PATENT AND TRADEMARK OFFICE
CERTIFICATE OF CORRECTION

PATENT NO. : 5,453,727
DATED : September 26, 1995
INVENTOR(S) : Ichiro SHIBASAKI et al.

It is certified that error appears in the above-indentified patent and that said Letters Patent is hereby corrected as shown below:

Claim 2, Column 31, Line 58, insert --,-- (a comma) between "layer" and "the".

Claim 32, Column 34, Line 3, "In$_x$Ga$_{1-x}$As$_y$Sb$_{1-y}$" should read --In$_x$Ga$_{1-x}$As$_y$Sb$_{1-y}$--.

Signed and Sealed this

Twenty-ninth Day of October 1996

Attest:

BRUCE LEHMAN

*Attesting Officer*  *Commissioner of Patents and Trademarks*